US012635520B2

(12) United States Patent
Machida

(10) Patent No.: US 12,635,520 B2
(45) Date of Patent: May 19, 2026

(54) SEMICONDUCTOR ELEMENT, METHOD FOR MANUFACTURING SEMICONDUCTOR ELEMENT, SEMICONDUCTOR DEVICE, AND METHOD FOR MANUFACTURING SEMICONDUCTOR DEVICE

(71) Applicants: TAMURA CORPORATION, Tokyo (JP); Novel Crystal Technology, Inc., Sayama (JP)

(72) Inventor: Nobuo Machida, Sayama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 682 days.

(21) Appl. No.: 17/788,914

(22) PCT Filed: Dec. 21, 2020

(86) PCT No.: PCT/JP2020/047653
§ 371 (c)(1),
(2) Date: Jun. 24, 2022

(87) PCT Pub. No.: WO2021/132145
PCT Pub. Date: Jul. 1, 2021

(65) Prior Publication Data
US 2023/0030874 A1      Feb. 2, 2023

(30) Foreign Application Priority Data

Dec. 26, 2019     (JP) ................................. 2019-236008

(51) Int. Cl.
*H10W 40/25*        (2026.01)
*H10D 8/60*         (2025.01)
(Continued)

(52) U.S. Cl.
CPC ............ *H10W 40/258* (2026.01); *H10D 8/60* (2025.01); *H10D 62/80* (2025.01); *H10P 54/00* (2026.01)

(58) Field of Classification Search
CPC .................................. H10D 8/60; H10D 62/80
See application file for complete search history.

(56) References Cited

U.S. PATENT DOCUMENTS 7,998,836 B1     8/2011   Shiomi et al.
8,816,481 B2     8/2014   Ikuta et al.
(Continued)

FOREIGN PATENT DOCUMENTS

CN       106575608 A      4/2017
CN       109923678 A      6/2019
(Continued)

OTHER PUBLICATIONS

"State-of-the-art technologies of gallium oxide power devices" by Higashiwaki (Year: 2017).*
(Continued)

*Primary Examiner* — Evren Seven
(74) *Attorney, Agent, or Firm* — Scully, Scott, Murphy & Presser, P.C.

(57)        ABSTRACT

A method for manufacturing a semiconductor element includes preparing a semiconductor wafer that includes a substrate including a $Ga_2O_3$-based semiconductor and an epitaxial layer including a $Ga_2O_3$-based semiconductor and located on the substrate, fixing the epitaxial layer side of the semiconductor wafer to a support substrate, thinning the substrate of the semiconductor wafer fixed to the support substrate, after the thinning of the substrate, forming an electrode on a lower surface of the substrate, bonding or forming a support metal layer on a lower surface of the electrode of the semiconductor wafer, and dicing the semi-
(Continued)

conductor wafer into individual pieces, thereby obtaining plural semiconductor elements each including the support metal layer. Thermal conductivity of the support metal layer is higher than thermal conductivity of the substrate.

2 Claims, 24 Drawing Sheets

(51) Int. Cl.
  H10D 62/80 (2025.01)
  H10P 54/00 (2026.01)

(56) References Cited

U.S. PATENT DOCUMENTS

| | | | |
|---|---|---|---|
| 9,065,004 | B2 | 6/2015 | Sugiyama et al. |
| 9,312,165 | B2 | 4/2016 | Hachigo et al. |
| 10,230,007 | B2 | 3/2019 | Sasaki et al. |
| 10,658,321 | B2 | 5/2020 | Inoto et al. |
| 10,840,384 | B2 | 11/2020 | Hirabayashi et al. |
| 2014/0054757 | A1 | 2/2014 | Ikuta et al. |
| 2014/0225229 | A1 | 8/2014 | Hachigo et al. |
| 2015/0008391 | A1 | 1/2015 | Sugiyama et al. |
| 2016/0343809 | A1* | 11/2016 | Green ............... H10D 62/8503 |
| 2017/0213918 | A1 | 7/2017 | Sasaki et al. |
| 2019/0088612 | A1 | 3/2019 | Inoto et al. |
| 2020/0058804 | A1 | 2/2020 | Hirabayashi et al. |

FOREIGN PATENT DOCUMENTS

| | | | |
|---|---|---|---|
| EP | 3 540 784 | A1 | 9/2019 |
| JP | H07-240484 | A | 9/1995 |
| JP | 2011018792 | A | 1/2011 |
| JP | 2013016580 | A | 1/2013 |
| JP | 2014-131005 | A | 7/2014 |
| JP | 2015-018840 | A | 1/2015 |
| JP | 2016031953 | A | 3/2016 |
| JP | 2018-78177 | A | 5/2018 |
| JP | 2019012836 | A | 1/2019 |
| JP | 2019-054155 | A | 4/2019 |
| WO | 2013065230 | A1 | 5/2013 |

OTHER PUBLICATIONS

Translation of International Preliminary Report on Patentability and Written Opinion dated Jul. 7, 2022 from corresponding International PCT Application No. PCT/JP2020/047653,.

Japanese Official Action dated Feb. 20, 2024 from related JP 2019-236008 together with an English language translation thereof.

Extended European Search Report dated Dec. 5, 2023 from related EP 20 90 5195.2.

Japanese Notice of Reasons for Refusal dated Jul. 30, 2024 from related JP 2019-236008 together with an English language translation thereof.

International Search Report dated Feb. 2, 2021 of corresponding International PCT Application No. PCT/JP2020/047653, 4 Pages.

Notice of Reasons for Refusal dated Dec. 17, 2024 received from the Japanese Patent Office in related JP 2019-236008 together with English language translation.

Official Action dated Apr. 18, 2025 received from the China National Intellectual Property Administration in related application CN 202080090313.4 together with English language translation.

Official Action dated Sep. 3, 2025 received from the China National Intellectual Property Administration in related application CN 202080090313.4 together with English language translation.

Official Action dated Nov. 6, 2025 received from the China National Intellectual Property Administration in related application CN 202080090313.4 together with English language translation.

Official Action dated Jan. 14, 2026 received from the China National Intellectual Property Administration in related application CN 202080090313.4 together with English language translation.

\* cited by examiner

*FIG. 2*

*FIG. 21A*
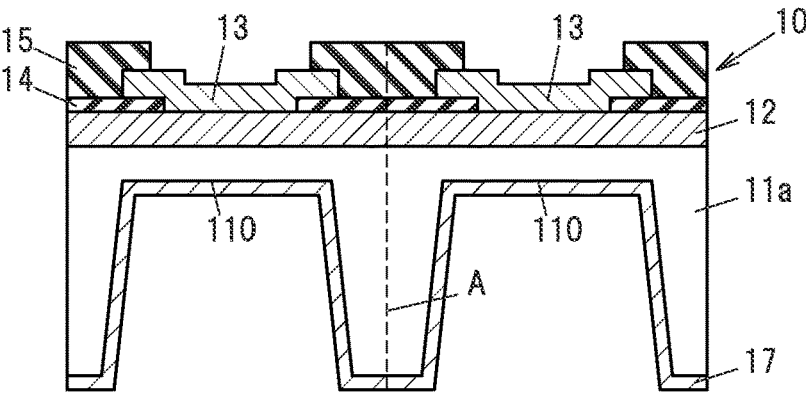
*FIG. 21B*
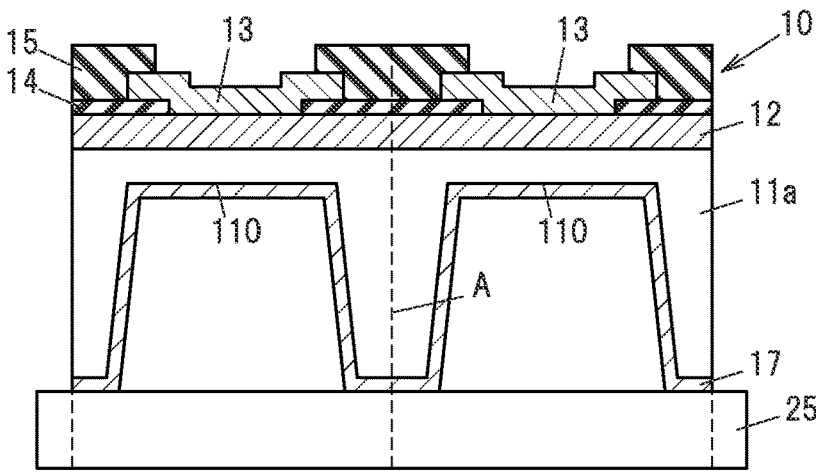
*FIG. 21C*

*FIG. 23*

SEMICONDUCTOR ELEMENT, METHOD FOR MANUFACTURING SEMICONDUCTOR ELEMENT, SEMICONDUCTOR DEVICE, AND METHOD FOR MANUFACTURING SEMICONDUCTOR DEVICE

TECHNICAL FIELD

The present invention relates to a semiconductor element, a method for manufacturing the semiconductor element, a semiconductor device, and a method for manufacturing the semiconductor device.

BACKGROUND ART $Ga_2O_3$-based semiconductors have a larger band gap than other semiconductors such as Si, SiC, GaN, and GaAs, hence, $Ga_2O_3$-based semiconductor elements formed using $Ga_2O_3$-based semiconductors exhibit excellent breakdown voltage. On the other hand, $Ga_2O_3$-based semiconductor elements with low thermal conductivity have the problem of poor heat dissipation.

To solve this problem of heat dissipation of $Ga_2O_3$-based semiconductor elements, there is a known technique in which a substrate formed of a $Ga_2O_3$-based semiconductor is thinned to allow heat to be easily released to the outside (e.g., Patent Literature 1).

In the process of manufacturing $Ga_2O_3$-based semiconductor elements in the technique described in Patent Literature 1, a substrate of a wafer, in which an epitaxial layer is formed on the substrate, is thinned by polishing, etc., in the state in which the epitaxial layer side of the wafer is fixed to a support substrate.

CITATION LIST

Patent Literatures

Patent Literature 1: JP 2019/12836 A

SUMMARY OF INVENTION

Technical Problem

However, Patent Literature 1 does not disclose a method of obtaining plural semiconductor elements by dicing one wafer into individual pieces. Wafers with thinned substrates have less mechanical strength and may be damaged during dicing.

It is an object of the invention to provide a method for manufacturing a semiconductor element formed using a $Ga_2O_3$-based semiconductor, which is a semiconductor element manufacturing method by which plural semiconductor elements having a structure with excellent heat dissipation can be obtained from one wafer while suppressing damage during dicing, a semiconductor element obtained by the semiconductor element manufacturing method, a method for manufacturing a semiconductor device including the semiconductor element manufacturing method, and a semiconductor device obtained by the method for manufacturing the semiconductor device.

Solution to Problem

To achieve the above-mentioned object, one aspect of the invention provides a method for manufacturing a semiconductor element defined by (1) to (4) below, a method for manufacturing a semiconductor device defined by (5) to (7), a semiconductor element defined by (8) to (10), and a semiconductor device defined by (11) to (13).

(1) A method for manufacturing a semiconductor element, comprising:

preparing a semiconductor wafer that comprises a substrate comprising a $Ga_2O_3$-based semiconductor and an epitaxial layer comprising a $Ga_2O_3$-based semiconductor and located on the substrate;

fixing the epitaxial layer side of the semiconductor wafer to a support substrate;

thinning the substrate of the semiconductor wafer fixed to the support substrate;

after the thinning of the substrate, forming an electrode on a lower surface of the substrate;

bonding or forming a support metal layer on a lower surface of the electrode of the semiconductor wafer; and dicing the semiconductor wafer into individual pieces, thereby obtaining a plurality of semiconductor elements each comprising the support metal layer, wherein thermal conductivity of the support metal layer is higher than thermal conductivity of the substrate.

(2) The method for manufacturing a semiconductor element defined by (1), wherein in the bonding or forming the support metal layer, a metal plate as the support metal layer is bonded to the electrode by a conductive adhesive, or a plating film as the support metal layer is formed on the electrode by a plating process.

(3) The method for manufacturing a semiconductor element defined by (1) or (2), wherein the support metal layer comprises a metal plate comprising a plurality of through-holes penetrating the support metal layer in a thickness direction, or depressions, that are provided along a dicing line, and wherein in the dicing the semiconductor wafer into individual pieces, the support metal layer is cut along the dicing line.

(4) A method for manufacturing a semiconductor element, comprising:

preparing a semiconductor wafer that comprises a substrate comprising a $Ga_2O_3$-based semiconductor and an epitaxial layer comprising a $Ga_2O_3$-based semiconductor and located on the substrate;

fixing the epitaxial layer side of the semiconductor wafer to a support substrate;

forming a recessed portion on a lower surface of the substrate of the semiconductor wafer fixed to the support substrate;

forming an electrode on the lower surface of the substrate including an inner surface of the recessed portion;

forming a conductor layer on a lower surface of the electrode so as to fill the recessed portion; and dicing the semiconductor wafer into individual pieces, thereby obtaining a plurality of semiconductor elements, wherein thermal conductivity of the conductor layer is higher than thermal conductivity of the substrate.

(5) A method for manufacturing a semiconductor device, comprising:

each step included in the method for manufacturing a semiconductor element defined by any one of (1) to (3); and fixing the support metal layer side of the semiconductor element to a lead frame or a wiring board, and electrically connecting the support metal layer to the lead frame or wiring on the wiring board,

wherein a thermal expansion coefficient of the support metal layer is between a thermal expansion coefficient of the substrate and a thermal expansion coefficient of the lead frame or a base material of the wiring board.

(6) A method for manufacturing a semiconductor device, comprising:

each step included in the method for manufacturing a semiconductor element defined by (4); and fixing the conductor layer side of the semiconductor element to a lead frame or a wiring board, and electrically connecting the conductor layer to the lead frame or wiring on the wiring board.

(7) A method for manufacturing a semiconductor device, comprising:

preparing a semiconductor wafer that comprises a substrate comprising a $Ga_2O_3$-based semiconductor and an epitaxial layer comprising a $Ga_2O_3$-based semiconductor and located on the substrate;

fixing the epitaxial layer side of the semiconductor wafer to a support substrate;

forming a recessed portion on a lower surface of the substrate of the semiconductor wafer fixed to the support substrate;

forming an electrode on the lower surface of the substrate including an inner surface of the recessed portion;

dicing the semiconductor wafer into individual pieces, thereby obtaining a plurality of semiconductor elements; and fixing the semiconductor element to a lead frame comprising a raised portion corresponding to the recessed portion of the substrate so that the raised portion is inserted into the recessed portion, and electrically connecting the electrode to the lead frame.

(8) A semiconductor element, comprising:

a substrate comprising a $Ga_2O_3$-based semiconductor and having a thickness of not more than 250 μm;

an epitaxial layer comprising a $Ga_2O_3$-based semiconductor and located on the substrate;

a first electrode on an upper surface of the epitaxial layer;

a second electrode on a lower surface of the substrate; and a support metal layer that is located on a lower surface of the second electrode and has a thermal conductivity higher than a thermal conductivity of the substrate.

(9) The semiconductor element defined by (8), wherein the support metal layer comprises a metal plate bonded to the electrode by a conductive adhesive, or a plating film formed on the electrode.

(10) A semiconductor element, comprising:

a substrate comprising a $Ga_2O_3$-based semiconductor and comprising a recessed portion on a lower surface thereof;

an epitaxial layer comprising a $Ga_2O_3$-based semiconductor and located on the substrate;

a first electrode on an upper surface of the epitaxial layer;

a second electrode on a lower surface of the substrate; and a conductor layer that is provided on a lower surface of the second electrode so as to fill the recessed portion and has a thermal conductivity higher than a thermal conductivity of the substrate.

(11) A semiconductor device, comprising:

the semiconductor element defined by (8) or (9); and a lead frame or a wiring board on which the semiconductor element is mounted, wherein the support metal layer side of the semiconductor element is fixed to the lead frame or the wiring board, and the support metal layer is electrically connected to the lead frame or wiring on the wiring board.

4

(12) A semiconductor device, comprising:

the semiconductor element defined by (10); and a lead frame or a wiring board on which the semiconductor element is mounted, wherein the conductor layer side of the semiconductor element is fixed to the lead frame or the wiring board, and the conductor layer is electrically connected to the lead frame or wiring on the wiring board.

(13) A semiconductor device, comprising:

a semiconductor element that comprises a substrate comprising a $Ga_2O_3$-based semiconductor and comprising a recessed portion on a lower surface thereof, an epitaxial layer comprising a $Ga_2O_3$-based semiconductor and located on the substrate, a first electrode on an upper surface of the epitaxial layer, and a second electrode on a lower surface of the substrate; and a lead frame which comprises a raised portion corresponding to the recessed portion of the substrate and on which the semiconductor element is mounted, wherein the semiconductor element is fixed to the lead frame so that the raised portion is inserted into the recessed portion, and the second electrode is electrically connected to the lead frame.

Advantageous Effects of Invention

According to the invention, it is possible to provide a method for manufacturing a semiconductor element formed using a $Ga_2O_3$-based semiconductor, which is a semiconductor element manufacturing method by which plural semiconductor elements having a structure with excellent heat dissipation can be obtained from one wafer while suppressing damage during dicing, a semiconductor element obtained by the semiconductor element manufacturing method, a method for manufacturing a semiconductor device including the semiconductor element manufacturing method, and a semiconductor device obtained by the method for manufacturing the semiconductor device.

BRIEF DESCRIPTION OF DRAWINGS

FIG. 2 is a vertical cross-sectional view showing a semiconductor device having the SBD in the first embodiment.

FIG. 21A is a vertical cross-sectional view showing an example of a process of manufacturing the SBD and the semiconductor device having the SBD in the fifth embodiment.

FIG. 21B is a vertical cross-sectional view showing the example of the process of manufacturing the SBD and the semiconductor device having the SBD in the fifth embodiment.

FIG. 21C is a vertical cross-sectional view showing the example of the process of manufacturing the SBD and the semiconductor device having the SBD in the fifth embodiment.

FIG. 23 is a vertical cross-sectional view showing a semiconductor device in the sixth embodiment.

DESCRIPTION OF EMBODIMENTS

First Embodiment

In the first embodiment, a Schottky barrier diode (SBD) is used as a vertical semiconductor element.
(Structure of a Semiconductor Element)

Figure 1:
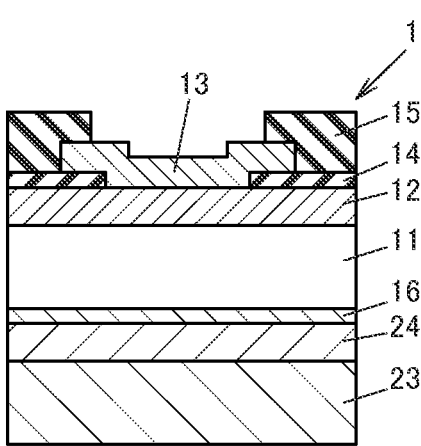
FIG. 1 is a vertical cross-sectional view showing a SBD in the first embodiment.

FIG. 1 is a vertical cross-sectional view showing a SBD 1 in the first embodiment. The SBD 1 includes a substrate 11, an epitaxial layer 12 formed on the substrate 11 by epitaxial growth, an anode electrode 13 that is formed on an upper surface (a surface on the opposite side to a surface in contact with the substrate 11) of the epitaxial layer 12 and is in Schottky contact with the epitaxial layer 12, a cathode electrode 16 that is formed on a lower surface (a surface on the opposite side to a surface in contact with the epitaxial layer 12) of the substrate 11 and is in ohmic contact with the substrate 11, and a metal plate 23 as the support metal layer bonded onto a lower surface (a surface on the opposite side to a surface in contact with the substrate 11) of the cathode electrode 16.

In the SBD 1, a Schottky barrier at an interface between the anode electrode 13 and the epitaxial layer 12 is lowered by applying a forward bias between the anode electrode 13 and the cathode electrode 16, allowing a current to flow from the anode electrode 13 to the cathode electrode 16. On the other hand, when a reverse bias is applied between the anode electrode 13 and the cathode electrode 16, the Schottky barrier at the interface between the anode electrode 13 and the epitaxial layer 12 increases and the current does not flow.

The substrate 11 and the epitaxial layer 12 are formed of a $Ga_2O_3$-based semiconductor and contain an n-type dopant. This n-type dopant is preferably a group IV element such as Si or Sn. An n-type dopant concentration in the substrate 11 is higher than an n-type dopant concentration in the epitaxial layer 12.

The $Ga_2O_3$-based semiconductor here is $Ga_2O_3$ or is $Ga_2O_3$ containing a substitutional impurity such as Al or In. The $Ga_2O_3$-based semiconductor is preferably a single crystal. The $Ga_2O_3$-based semiconductor is also preferably a β-type crystal.

Using Table 1 below, characteristics of β-type $Ga_2O_3$ (β-$Ga_2O_3$) will be described in comparison with characteristics of other semiconductors.

TABLE 1

| | Band gap [eV] | Thermal conductivity [W/(cm · K)] |
|---|---|---|
| Si | 1.1 | 1.5 |
| GaAs | 1.4 | 0.5 |

TABLE 1-continued

| | Band gap [eV] | Thermal conductivity [W/(cm · K)] |
|---|---|---|
| GaN | 3.4 | 2.3 |
| SiC | 3.3 | 4.9 |
| β-$Ga_2O_3$ | 4.8 | 0.2 |

As shown in Table 1, $Ga_2O_3$ has a larger band gap than Si, GaAs, GaN and SiC, indicating that it provides excellent breakdown voltage when used as a material for semiconductor element.

On the other hand, $Ga_2O_3$ has low thermal conductivity and causes a problem of poor heat dissipation when used as a material for semiconductor element. Particularly when a semiconductor element is face-up mounted on a lead frame or a wiring board, a thick substrate exists between an epitaxial layer as a heat source and the lead frame or the wiring board and it is thus difficult to efficiently release heat to the lead frame or the wiring board.

For this reason, the substrate 11 of the SBD 1 in the first embodiment is thinned by a thinning process to reduce a distance between the epitaxial layer 12 and the lead frame or the wiring board, and heat generated in the epitaxial layer 12 is thereby easily released to the lead frame or the wiring board.

The substrate 11 is thinned by the thinning process in the course of manufacturing the SBD 1 as described above and is thus thinner than base substrates used in known semiconductor elements and preferably has a thickness of, e.g., not more than 250 μm. Since the substrate 11 is thin, heat generated in the epitaxial layer 12 can be efficiently released from the substrate 11 side. Therefore, the SBD 1 has excellent heat dissipation characteristics. The thinner the substrate 11, the better the heat dissipation characteristics of the SBD 1. The thin substrate 11 also has the effect of reducing on-resistance of the SBD 1.

When the substrate 11 is thinned by the thinning process, heat dissipation of the SBD 1 is more enhanced by having the thinner the substrate 11, but the possibility of damage during the thinning process increases if the thickness is less than 250 μm, and the possibility of damage further increases if less than 30 μm. Therefore, to suppress damage on the substrate 11, the thickness of the substrate 11 is preferably not less than 30 μm, more preferably not less than 250 μm.

As such, the thickness of the substrate 11 is appropriately set in consideration of heat dissipation of the SBD 1, the possibility of damage on the substrate 11, and variation in the thickness of the substrate 11, etc.

A thickness of the epitaxial layer 12 is, e.g., 0.4 to 80 μm.

The anode electrode 13 is formed of a metal such as Mo, Pt, or Ni. The anode electrode 13 may have a multilayer structure formed by stacking films of different metals, e.g., Mo/Al, Pt/Au, Ni/Au, Ni/Ti/Au or Pt/Al, etc.

An electrode termination structure may be provided on the epitaxial layer 12. As the electrode termination structure, it is possible to use, e.g., a field plate structure in which an edge of the anode electrode 13 on the surface of the epitaxial layer 12 rides over an insulating film, a guard ring structure in which acceptor ions are implanted into the surface of the epitaxial layer 12 on both sides of the anode electrode 13, a mesa structure in which both sides of the anode electrode 13 on the surface of the epitaxial layer 12 are removed, and a combination thereof.

In the example shown in FIG. 1, a field plate structure is formed, in which an edge of the anode electrode 13 rides over an insulating film 14 that is formed of $SiO_2$, etc., and is provided on an outer peripheral portion of the upper surface of the epitaxial layer 12. An outer peripheral portion and side surface of the field plate portion of the anode electrode 13 are covered with an insulator 15.

The cathode electrode 16 is formed of a metal capable of forming an ohmic junction with a $Ga_2O_3$-based semiconductor, such as Ti. The cathode electrode 16 may have a multilayer structure formed by stacking films of different metals, e.g., Ti/Ni/Au or Ti/Al. When having a multilayer structure, a layer in contact with the substrate 11 is formed of a metal capable of forming an ohmic junction with a $Ga_2O_3$-based semiconductor. In this regard, if a conductive adhesive 24 or a plating film 81 (described later) is brought into direct contact with the substrate 11 or the epitaxial layer 12 without providing the cathode electrode 16, the ohmic junction may not be formed.

The metal plate 23 is used to compensate for a decrease in mechanical strength caused by the thinning process performed on the substrate 11 in the course of manufacturing the SBD 1. The metal plate 23 is bonded to the cathode electrode 16 by the conductive adhesive 24 such as nano silver paste or solder (e.g., Au—Sn low-melting point solder).

A thickness of the metal plate 23 is, e.g., 30 to 800 µm, and is preferably 100 to 400 µm. Mechanical strength may be insufficient when the thickness is less than 100 µm, and singulation by dicing may be difficult when more than 400 µm.

Thermal conductivity of the metal plate 23 is higher than thermal conductivity of the substrate 11. Thus, a decrease in the efficiency of heat dissipation through the metal plate 23 can be suppressed.

Figure 2:
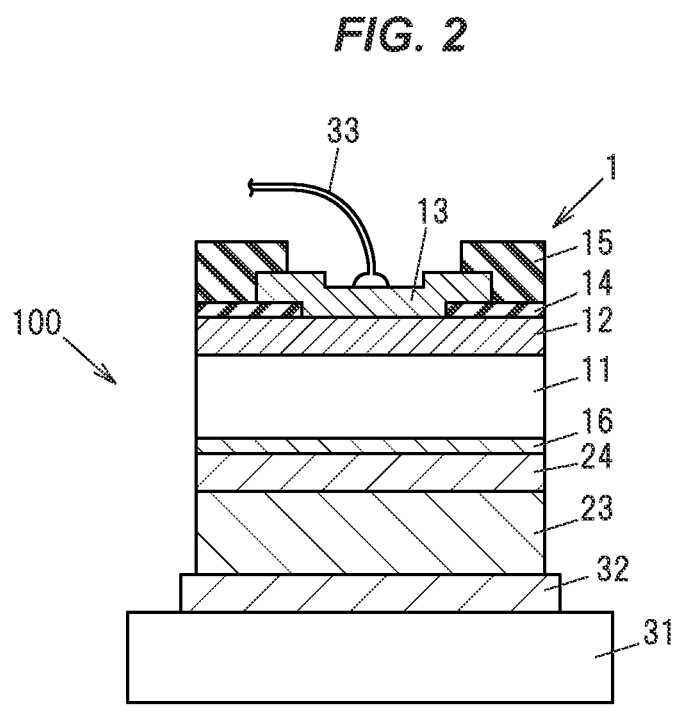

FIG. 2 is a vertical cross-sectional view showing a semiconductor device 100 having the SBD 1. The semiconductor device 100 includes a lead frame 31 and the SBD 1 face-up mounted on the lead frame 31. The SBD 1 is fixed to the lead frame 31 by a conductive adhesive 32 such as nano silver paste or solder (e.g., Au—Sn low-melting point solder).

The metal plate 23 of the SBD 1 is electrically connected to the lead frame 31 through the conductive adhesive 32. The anode electrode 13 of the SBD 1 is connected to a predetermined portion of the lead frame 31 (a portion insulated from a portion to which the metal plate 23 is connected) through a bonding wire 33 formed of Al, etc.

Since the substrate 11 is processed and thinned as described above, a distance between the epitaxial layer 12 as a heat source and the lead frame 31 is small and heat generated in the epitaxial layer 12 can be efficiently released to the lead frame 31.

In addition, to suppress separation of the substrate 11 due to a difference in thermal expansion rate between the substrate 11 and the lead frame 31, a thermal expansion coefficient of the metal plate 23 is preferably between a thermal expansion coefficient of the substrate 11 and a thermal expansion coefficient of the lead frame 31.

When, e.g., the lead frame 31 is formed of copper or a copper-based alloy, it is preferable that the metal plate 23 be also formed of a copper-based alloy such as Cu—Mo alloy to satisfy the above-mentioned conditions of the thermal expansion coefficient.

In addition, a wiring board may be used in place of the lead frame 31. In this case, the metal plate 23 of the SBD 1 is electrically connected to wiring on the wiring board through the conductive adhesive 32. In addition, the thermal expansion coefficient of the metal plate 23 is preferably between the thermal expansion coefficient of the substrate 11 and a thermal expansion coefficient of a base material of the wiring board. When the SBD 1 does not include the substrate 11, the thermal expansion coefficient of the metal plate 23 is preferably between a thermal expansion coefficient of the epitaxial layer 12 and the thermal expansion coefficient of the base material of the wiring board.

Figure 3A:
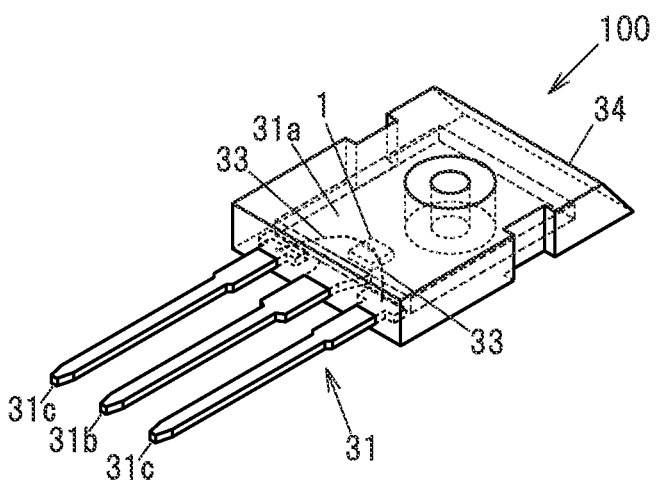
FIG. 3A is a perspective view showing an example of the overall configuration of the semiconductor device as a package in which the SBD is sealed.
Figure 3B:
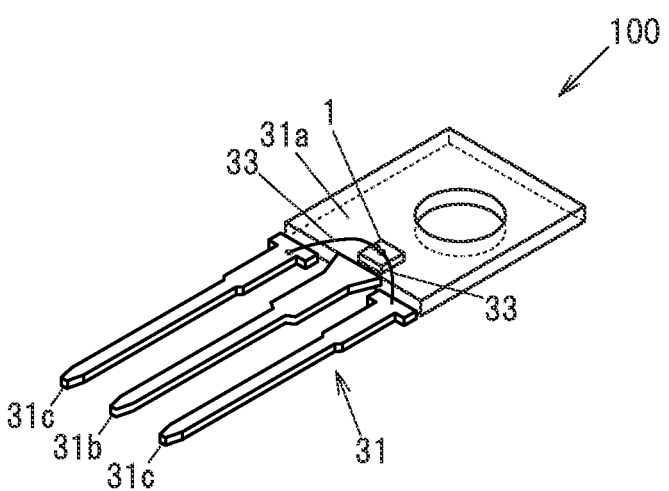
FIG. 3B is a perspective view showing the example of the overall configuration of the semiconductor device as a package in which the SBD is sealed.

FIGS. 3A and 3B are perspective views showing an example of the overall configuration of the semiconductor device 100 as a package in which the SBD 1 is sealed. FIG. 3B is a diagram in which illustration of a molded resin 34 (described later) is omitted. In this example, the lead frame 31 has a pad portion 31a, a terminal portion 31b electrically connected to the pad portion 31a, and terminal portions 31c insulated from the pad portion 31a.

The metal plate 23 of the SBD 1 is connected to the pad portion 31a, and the bonding wires 33 are connected to the terminal portions 31c. The pad portion 31a with the SBD 1 mounted thereon and end portions of the terminal portions 31b and 31c on the pad portion 31a side are sealed with molded resin 34.

Next, a method for manufacturing the SBD 1 in the first embodiment will be described with a specific example. However, the method for manufacturing the SBD 1 is not limited to the following example.

(Method for Manufacturing the Semiconductor Element)

FIGS. 4A to 4C, 5A to 5C, 6A and 6B are vertical cross-sectional views showing an example of a process of manufacturing the SBD 1 and the semiconductor device 100 having the SBD 1 in the first embodiment.

Figure 4A:
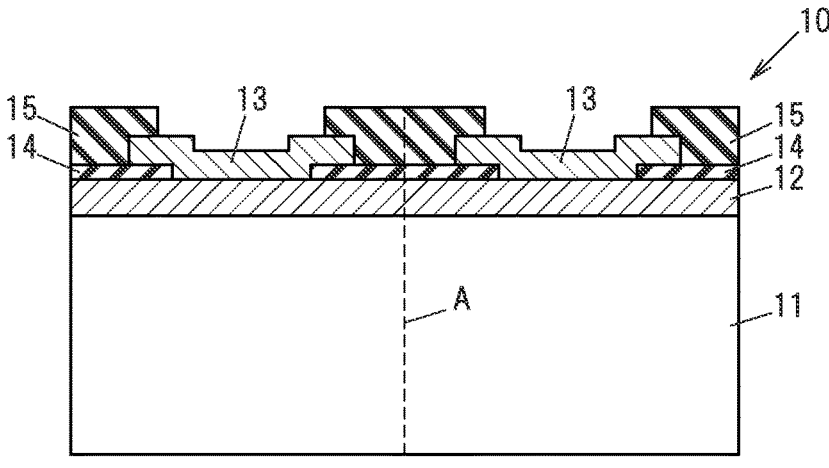
FIG. 4A is a vertical cross-sectional view showing an example of a process of manufacturing the SBD and the semiconductor device having the SBD in the first embodiment.

Firstly, a semiconductor wafer 10 is prepared, as shown in FIG. 4A. A dotted line A in the drawing is a line indicating the position to be cut in a later step (a dicing line). The semiconductor wafer 10 has the substrate 11, the epitaxial layer 12, the anode electrodes 13, and the insulating film 14. In this regard, the anode electrodes 13 and the insulating film 14 may not be included in the semiconductor wafer 10 at this stage and may be formed in a later step.

The substrate 11 is obtained, e.g., by slicing a $\beta$-$Ga_2O_3$ single crystal, which is grown by the EFG method and contains a high concentration of an n-type dopant, to a desired thickness, and then polishing. The thickness of the substrate 11 at this stage is, e.g., 600 µm.

The epitaxial layer 12 is formed by epitaxially growing a $\beta$-$Ga_2O_3$ single crystal on the substrate 11 using, e.g., the HVPE (Hydride Vapor Phase Epitaxy) method, the PLD (Pulsed Laser Deposition) method, the CVD (Chemical Vapor Deposition) method, or the MBE (Molecular Beam Epitaxy) method.

The method of introducing an n-type dopant into the epitaxial layer 12 is, e.g., a method in which a $Ga_2O_3$ crystal film containing an n-type dopant is epitaxially grown, or a method in which a $Ga_2O_3$ crystal film is grown and an n-type dopant is then implanted by the ion implantation method.

Figure 4B:
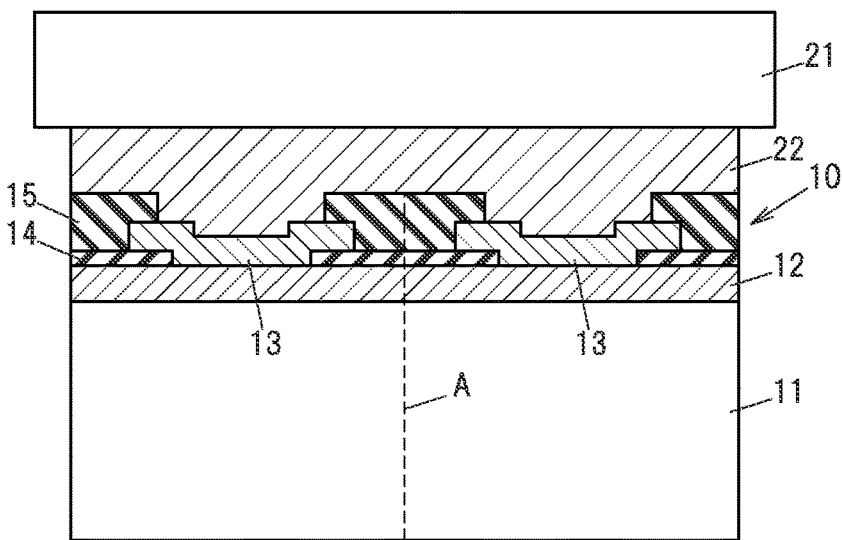
FIG. 4B is a vertical cross-sectional view showing the example of the process of manufacturing the SBD and the semiconductor device having the SBD in the first embodiment.

Next, as shown in FIG. 4B, the epitaxial layer 12 side (the upper side in FIG. 4B) of the semiconductor wafer 10 is fixed to a support substrate 21 by an adhesive 22 such as wax. In the example shown in FIG. 4B, the semiconductor wafer 10 including the anode electrodes 13 and the insulating film 14 is fixed to the support substrate 21, hence, the adhesive 22 is applied to the upper surfaces of the anode electrodes 13 and the insulating film 14.

As the support substrate 21, it is preferable to use a substrate with a high surface flatness, such as high-precision glass substrate or sapphire substrate.

In addition, an adhesive with heat resistance not losing adhesiveness at around a melting point of the conductive adhesive 24 is used as the adhesive 22 so that the adhesive 22 still retains adhesiveness when the metal plate 23 is bonded to the semiconductor wafer 10 by the conductive adhesive 24 in a later step. When, e.g., a nano silver paste is used as the conductive adhesive 24, an adhesive with heat resistance of not less than 200° C. is used. When Au—Sn low-melting point solder is used as the conductive adhesive 24, an adhesive with heat resistance of not less than 280° C. is used.

Figure 4C:
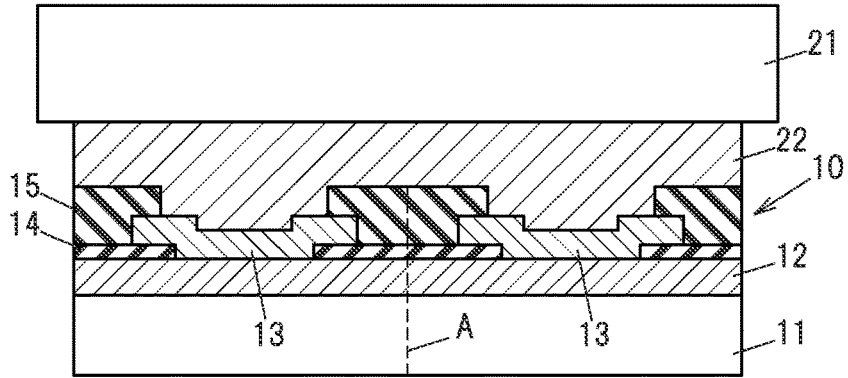
FIG. 4C is a vertical cross-sectional view showing the example of the process of manufacturing the SBD and the semiconductor device having the SBD in the first embodiment.

Next, as shown in FIG. 4C, the substrate 11 supported by the support substrate 21 is thinned by performing a thinning process on the lower surface. The thinning process on the substrate 11 is performed by grinding, lapping, or CMP (Chemical Mechanical Polishing), etc.

The thickness of the substrate 11 after the thinning process is preferably not more than 150 μm to obtain sufficient heat dissipation, as described above. It is also preferably not less than 50 μm, more preferably not less than 100 μm, to suppress damage during the thinning process.

Figure 5A:
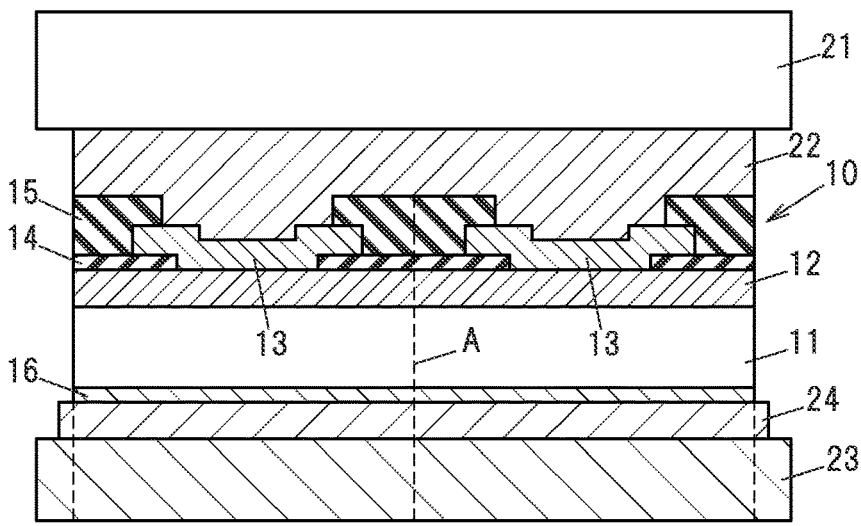
FIG. 5A is a vertical cross-sectional view showing the example of the process of manufacturing the SBD and the semiconductor device having the SBD in the first embodiment.

Next, as shown in FIG. 5A, the cathode electrode 16 is formed on the lower surface (a surface on the opposite side to the epitaxial layer 12) of the substrate 11, and the metal plate 23 as the support metal layer is bonded to the lower surface of the cathode electrode 16 using the conductive adhesive 24.

The cathode electrode 16 may be formed on the entire surface of the semiconductor wafer 10, as shown in FIG. 5A. Alternatively, the cathode electrode 16 may be formed so as not to be present on the dicing line in order to prevent clogging of a blade with the metal constituting the cathode electrode 16 during dicing. The cathode electrode 16 in this case is formed, e.g., by forming a mask pattern on the substrate 11 using photolithography, then depositing a metal film such as Ti/Au on the entire surface of the substrate 11, and removing the mask pattern and the metal film thereon using lift-off.

Figure 7:
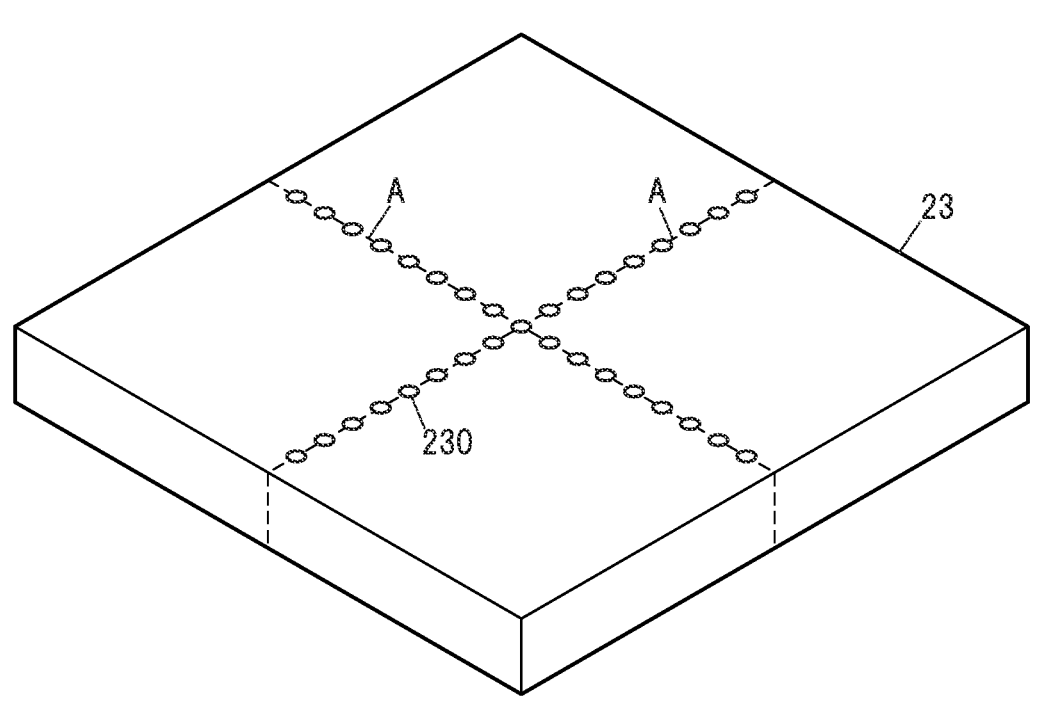
FIG. 7 is a perspective view showing an example of a metal plate.

FIG. 7 is a perspective view showing an example of the metal plate 23. As shown in FIG. 7, it is preferable that the metal plate 23 have plural through-holes 230 that penetrate the metal plate 23 in a thickness direction thereof and are provided along dicing lines A. The pattern of the through-holes 230 formed along the dicing lines A is not specifically limited and may be, e.g., a dashed line pattern, besides the dotted line pattern shown in FIG. 7. Alternatively, depressions which are recessed on the metal plate 23 in the thickness direction thereof and provided along the dicing lines A may be included in place of the through-holes 230. In this case, the metal plate 23 is bonded to the cathode electrode 16 so that a surface with the depressions faces downward (faces the side opposite to the cathode electrode 16). The depressions may be formed such that one continuous depression is provided along each dicing line A.

Since properties such as mechanical strength are greatly different between the metal plate 23 and the substrate 11, or the epitaxial layer 12, formed of a Ga₂O₃-based semiconductor, the blade tends to clog during dicing in a later step. Thus, by providing the through-holes 230 or depressions on the metal plate 23, the amount ground by the blade during dicing can be reduced and clogging can be suppressed.

The metal plate 23 in the example shown in FIG. 5A is one continuous plate and is cut together with the semiconductor wafer 10 in the dicing step performed later, but plural metal plates may be used in place of the one continuous metal plate so that one metal plate is bonded to each element region (a region to be one SBD 1 after dicing). In this case, the number of steps increases since one metal plate is bonded to each element region, but clogging of the blade can be suppressed due to no cutting of the metal plate 23 in the dicing step.

Figure 5B:
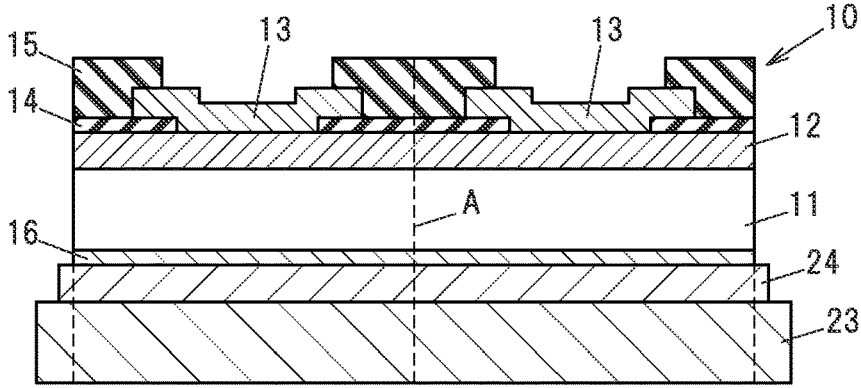
FIG. 5B is a vertical cross-sectional view showing the example of the process of manufacturing the SBD and the semiconductor device having the SBD in the first embodiment.

Next, as shown in FIG. 5B, the semiconductor wafer 10 supported by the metal plate 23 is separated from the support substrate 21 and the adhesive 22.

Figure 5C:
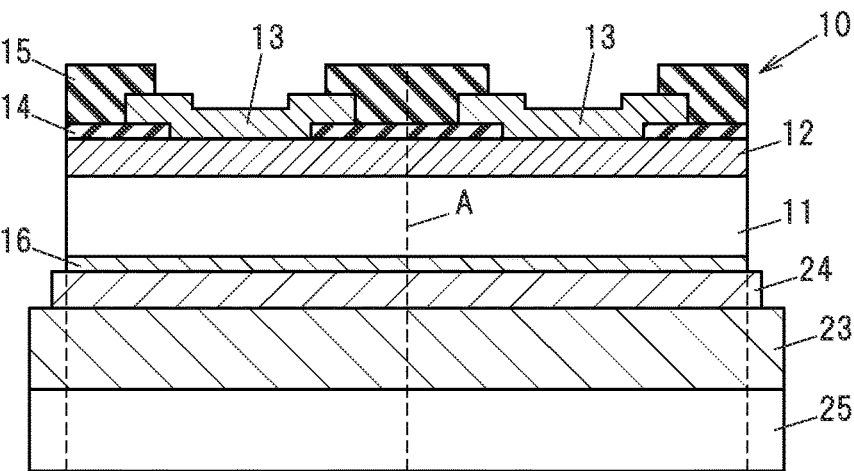
FIG. 5C is a vertical cross-sectional view showing the example of the process of manufacturing the SBD and the semiconductor device having the SBD in the first embodiment.

Next, as shown in FIG. 5C, a dicing tape 25 is attached to a lower surface of the metal plate 23.

Figure 6A:
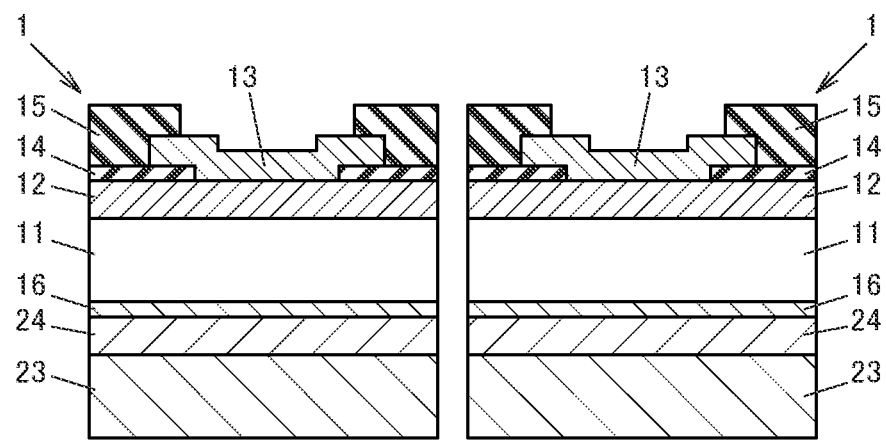
FIG. 6A is a vertical cross-sectional view showing the example of the process of manufacturing the SBD and the semiconductor device having the SBD in the first embodiment.

Next, as shown in FIG. 6A, the semiconductor wafer 10 is singulated into individual pieces by dicing, thereby obtaining plural SBDs 1 each including the metal plate 23. In this step, the semiconductor wafer 10 and the metal plate 23 are cut along the dicing line A by a dicing blade. Here, since mechanical strength of the semiconductor wafer 10 is reinforced by the metal plate 23, damage on the semiconductor wafer 10 at the time of dicing can be suppressed.

In this regard, when plural metal plates are prepared as the metal plate 23 and one metal plate is bonded to each element region in the step shown in FIG. 5A, the dicing step shown in FIG. 6A is performed with no cutting of the metal plate 23.

Figure 6B:
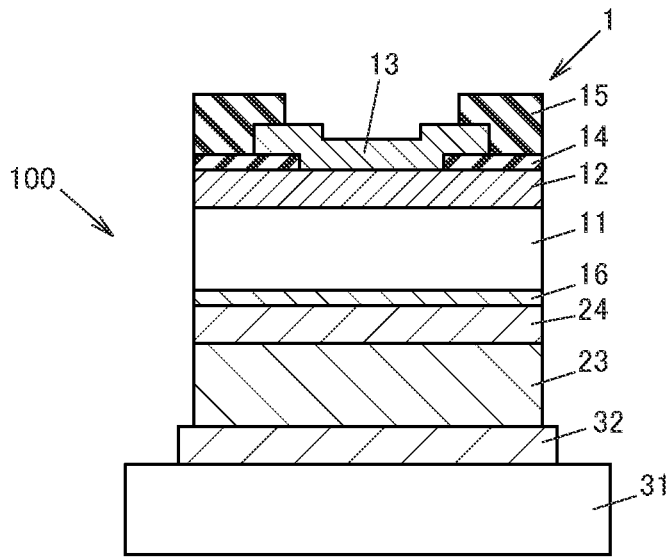
FIG. 6B is a vertical cross-sectional view showing the example of the process of manufacturing the SBD and the semiconductor device having the SBD in the first embodiment.

Next, as shown in FIG. 6B, the metal plate 23 side of the SBD 1 is fixed to the lead frame 31, and the metal plate 23 is electrically connected to the lead frame 31. Alternatively, a wiring board may be used in place of the lead frame 31, as described above. When the wiring board is used, the metal plate 23 is electrically connected to wiring on the wiring board. Then, after connection of the bonding wire 33, etc., the semiconductor device 100 is obtained.

Second Embodiment

The second embodiment is different from the first embodiment in that a trench SBD or a junction field effect transistor (JFET) is used as a vertical semiconductor element. Note that, description for the same features as those in the first embodiment may be omitted or simplified.
(Structure of the Semiconductor Element)

Figure 8A:
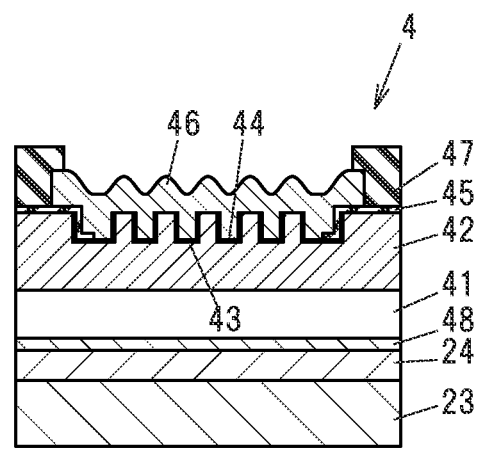
FIG. 8A is a vertical cross-sectional view showing a trench SBD in the second embodiment.

FIG. 8A is a vertical cross-sectional view showing a trench SBD 4 in the second embodiment. The trench SBD 4 includes a substrate 41, an epitaxial layer 42 formed on the substrate 41 by epitaxial growth, trenches 43 formed on an upper surface (a surface on the opposite side to a surface in contact with the substrate 41) of the epitaxial layer 42, insulating films 44 covering inner surfaces of the trenches 43, an insulating film 45 covering the inner surfaces of the outer trenches 43 and an outer peripheral portion of the upper surface of the epitaxial layer 42, an anode electrode 46 that is formed on the upper surface of the epitaxial layer 42 so as to fill the trenches 43 and is in Schottky contact with the epitaxial layer 42, an insulator 47 covering a side surface of the anode electrode 46, a cathode electrode 48 that is formed on a lower surface (a surface on the opposite side to a surface in contact with the epitaxial layer 42) of the substrate 41 and is in ohmic contact with the substrate 41, and the metal plate 23 as the support metal layer bonded onto a lower surface (a surface on the opposite side to a surface in contact with the substrate 41) of the cathode electrode 48.

The substrate 41 and the epitaxial layer 42 are formed of a Ga₂O₃-based semiconductor, in the same manner as the substrate 11 and the epitaxial layer 12 in the first embodiment. In addition, the substrate 41 is thinned by the thinning process to improve heat dissipation in the same manner as the first embodiment, and the thickness thereof can be set in the same manner as the substrate 11.

The anode electrode 46 and the cathode electrode 48 can be respectively formed of the same materials as the anode electrode 13 and the cathode electrode 16 in the first embodiment.

The metal plate 23 is used to compensate for a decrease in mechanical strength caused by the thinning process performed on the substrate 41 in the course of manufacturing the trench SBD 4. The metal plate 23 is bonded to the cathode electrode 48 by the conductive adhesive 24 such as nano silver paste or solder (e.g., Au—Sn low-melting point solder).

The thickness of the metal plate 23 is, e.g., 30 to 800 μm, and is preferably 100 to 400 μm. Mechanical strength may be insufficient when the thickness is less than 100 μm, and singulation by dicing may be difficult when more than 400 μm.

Thermal conductivity of the metal plate 23 is higher than thermal conductivity of the substrate 41. Thus, a decrease in the efficiency of heat dissipation through the metal plate 23 can be suppressed.

Figure 8B:
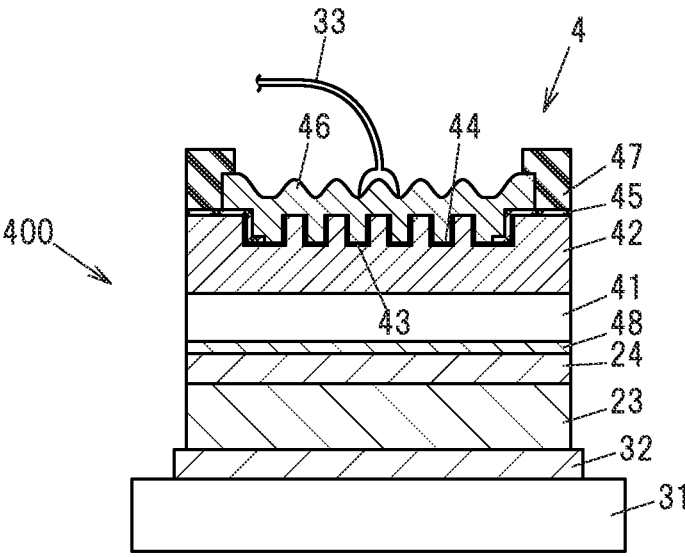
FIG. 8B is a vertical cross-sectional view showing a semiconductor device having the trench SBD in the second embodiment.

FIG. 8B is a vertical cross-sectional view showing a semiconductor device 400 having the trench SBD 4. The semiconductor device 400 includes the lead frame 31 and the trench SBD 4 face-up mounted on the lead frame 31. The trench SBD 4 is fixed to the lead frame 31 by the conductive adhesive 32 such as nano silver paste or solder (e.g., Au—Sn low-melting point solder). The lead frame 31 and the conductive adhesive 32 are respectively the same as those used in the first embodiment.

The metal plate 23 of the trench SBD 4 is electrically connected to the lead frame 31 through the conductive adhesive 32. The anode electrode 46 of the trench SBD 4 is connected to a predetermined portion of the lead frame 31 (a portion insulated from a portion to which the metal plate 23 is connected) through the bonding wire 33.

Since the substrate 41 is processed and thinned as described above, a distance between the epitaxial layer 42 as a heat source and the lead frame 31 is small and heat generated in the epitaxial layer 42 can be efficiently released to the lead frame 31.

In addition, to suppress separation of the substrate 41 due to a difference in thermal expansion rate between the substrate 41 and the lead frame 31, the thermal expansion coefficient of the metal plate 23 is preferably between a thermal expansion coefficient of the substrate 41 and the thermal expansion coefficient of the lead frame 31.

In addition, a wiring board may be used in place of the lead frame 31. In this case, the metal plate 23 of the trench SBD 4 is electrically connected to wiring on the wiring board through the conductive adhesive 32. In addition, the thermal expansion coefficient of the metal plate 23 is preferably between the thermal expansion coefficient of the substrate 41 and the thermal expansion coefficient of the base material of the wiring board. When the trench SBD 4 does not include the substrate 41, the thermal expansion coefficient of the metal plate 23 is preferably between a thermal expansion coefficient of the epitaxial layer 42 and the thermal expansion coefficient of the base material of the wiring board.

Next, a method for manufacturing the trench SBD 4 in the second embodiment will be described with a specific example. However, the method for manufacturing the trench SBD 4 is not limited to the following example.
(Method for Manufacturing the Semiconductor Element)

FIGS. 9A to 9C, 10A to 10C, 11A and 11B are vertical cross-sectional views showing an example of a process of manufacturing the trench SBD 4 and the semiconductor device 400 having the trench SBD 4 in the second embodiment.

Figure 9A:
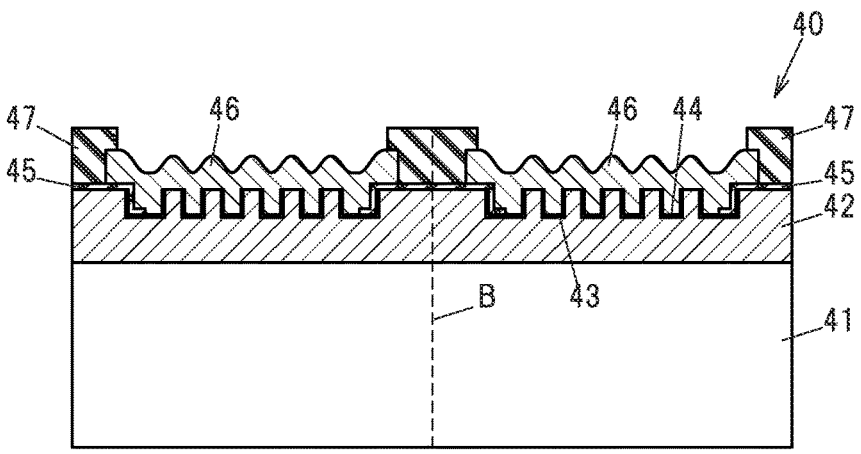
FIG. 9A is a vertical cross-sectional view showing an example of a process of manufacturing the trench SBD and the semiconductor device having the trench SBD in the second embodiment.

Firstly, a semiconductor wafer 40 is prepared, as shown in FIG. 9A. A dotted line B in the drawing is a line indicating the position to be cut in a later step (a dicing line). The semiconductor wafer 40 has the substrate 41, the epitaxial layer 42 having the trenches 43, the insulating films 44, the insulating film 45, the anode electrodes 46, and the insulator 47.

Figure 9B:
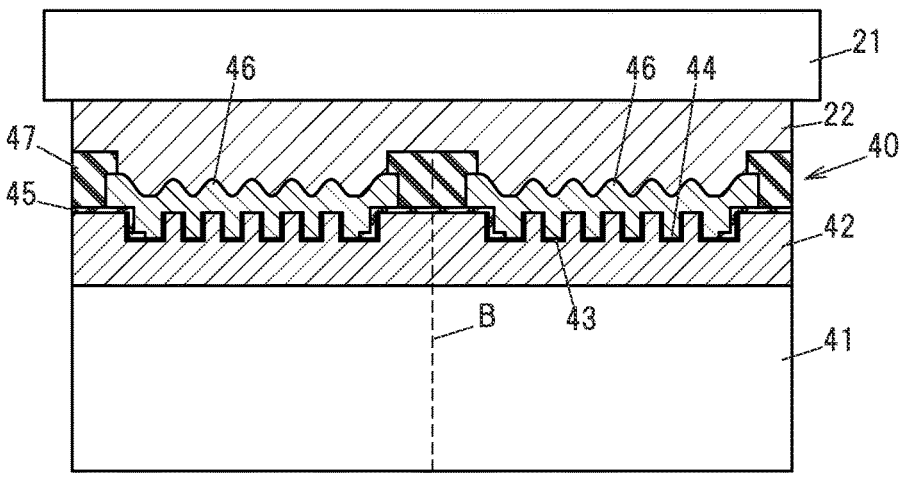
FIG. 9B is a vertical cross-sectional view showing the example of the process of manufacturing the trench SBD and the semiconductor device having the trench SBD in the second embodiment.

Next, as shown in FIG. 9B, the epitaxial layer 42 side (the upper side in FIG. 9B) of the semiconductor wafer 40 is fixed to the support substrate 21 by the adhesive 22 such as wax. In the example shown in FIG. 9B, the semiconductor wafer 40 including the anode electrodes 46 and the insulator 47 is fixed to the support substrate 21, hence, the adhesive 22 is applied to the upper surfaces of the anode electrodes 46 and the insulator 47.

The support substrate 21 and the adhesive 22 are respectively the same as those used in the first embodiment.

Figure 9C:
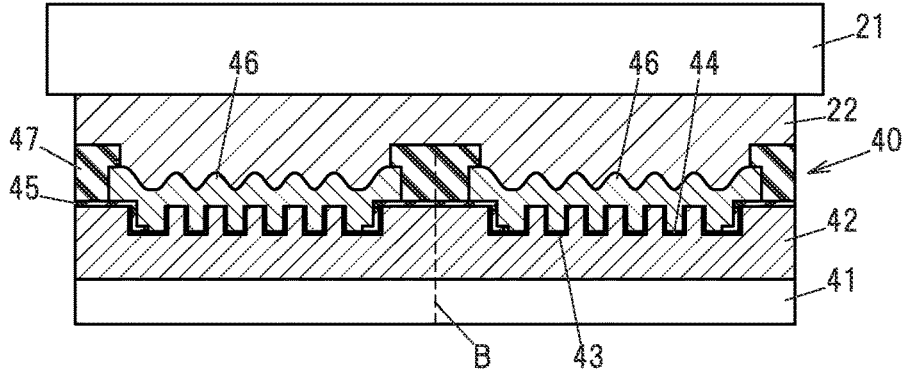
FIG. 9C is a vertical cross-sectional view showing the example of the process of manufacturing the trench SBD and the semiconductor device having the trench SBD in the second embodiment.

Next, as shown in FIG. 9C, the substrate 41 supported by the support substrate 21 is thinned by performing a thinning process on the lower surface. The thinning process on the substrate 41 is performed by grinding, lapping, or CMP, etc.

The thickness of the substrate 41 after the thinning process is preferably not more than 150 μm to obtain sufficient heat dissipation, as described above. It is also preferably not less than 50 μm, more preferably not less than 100 μm, to suppress damage during the thinning process.

Figure 10A:
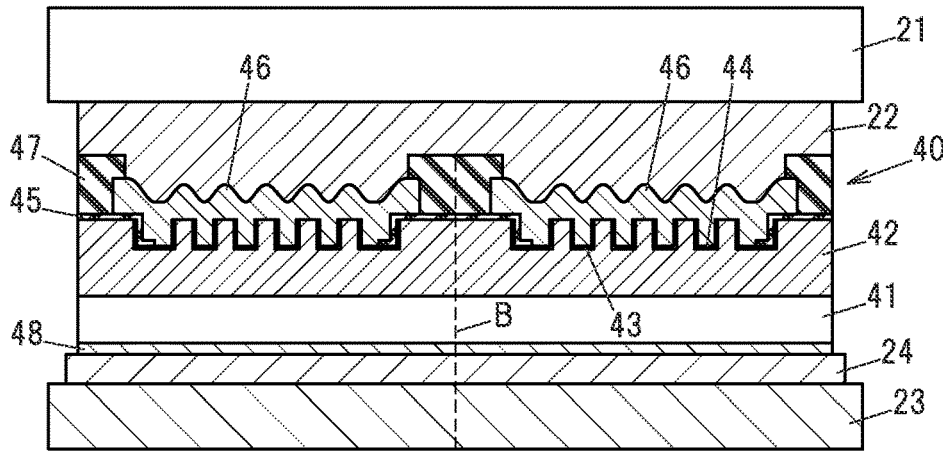
FIG. 10A is a vertical cross-sectional view showing the example of the process of manufacturing the trench SBD and the semiconductor device having the trench SBD in the second embodiment.

Next, as shown in FIG. 10A, the cathode electrode 48 is formed on the lower surface of the substrate 41, and the metal plate 23 as the support metal layer is bonded to the lower surface of the cathode electrode 48 using the conductive adhesive 24.

Figure 10B:
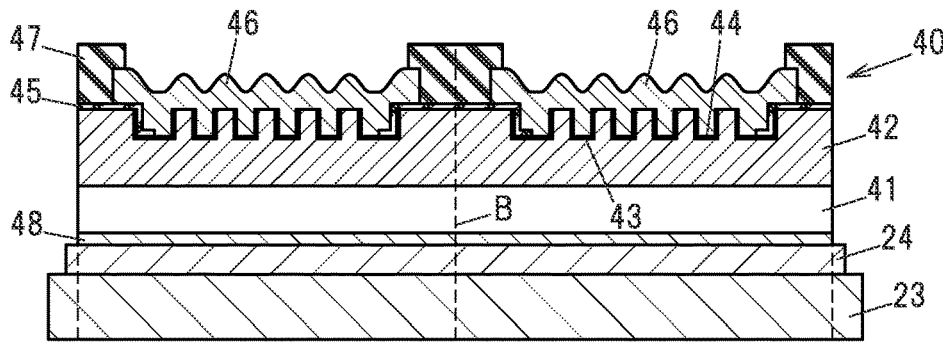
FIG. 10B is a vertical cross-sectional view showing the example of the process of manufacturing the trench SBD and the semiconductor device having the trench SBD in the second embodiment.

Next, as shown in FIG. 10B, the semiconductor wafer 40 supported by the metal plate 23 is separated from the support substrate 21 and the adhesive 22.

Figure 10C:
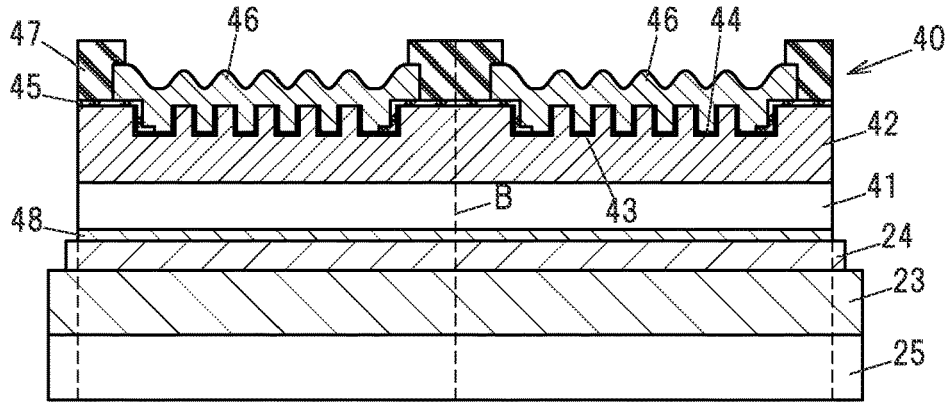
FIG. 10C is a vertical cross-sectional view showing the example of the process of manufacturing the trench SBD and the semiconductor device having the trench SBD in the second embodiment.

Next, as shown in FIG. 10C, the dicing tape 25 is attached to the lower surface of the metal plate 23.

Figure 11A:
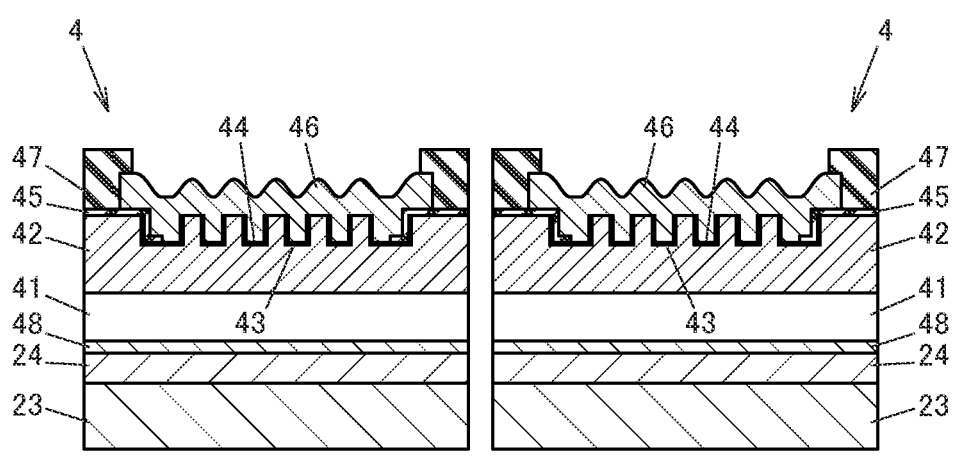
FIG. 11A is a vertical cross-sectional view showing the example of the process of manufacturing the trench SBD and the semiconductor device having the trench SBD in the second embodiment.

Next, as shown in FIG. 11A, the semiconductor wafer 40 is singulated into individual pieces by dicing, thereby obtaining plural trench SBDs 4 each including the metal plate 23. In this step, the semiconductor wafer 40 and the metal plate 23 are cut along the dicing line B by the dicing blade. Here, since mechanical strength of the semiconductor wafer 40 is reinforced by the metal plate 23, damage on the semiconductor wafer 40 during dicing can be suppressed.

In this regard, when plural metal plates are provided as the metal plate 23 and one metal plate is bonded to each element region in the step shown in FIG. 10A, the dicing step shown in FIG. 11A is performed with no cutting of the metal plate 23.

Figure 11B:
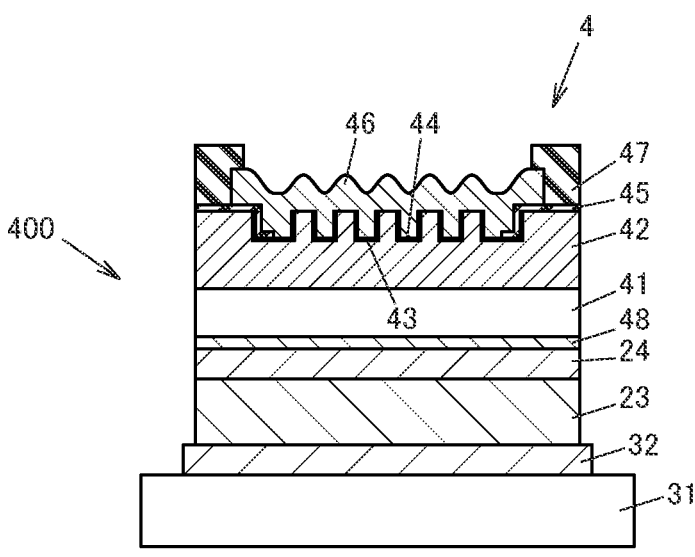
FIG. 11B is a vertical cross-sectional view showing the example of the process of manufacturing the trench SBD and the semiconductor device having the trench SBD in the second embodiment.

Next, as shown in FIG. 11B, the metal plate 23 side of the trench SBD 4 is fixed to the lead frame 31, and the metal plate 23 is electrically connected to the lead frame 31. Alternatively, a wiring board may be used in place of the lead frame 31, as described above. When the wiring board is used, the metal plate 23 is electrically connected to wiring on the wiring board. Then, after connection of the bonding wire 33, etc., the semiconductor device 400 is obtained.

As described above, also when the trench SBD 4 is used as the vertical semiconductor element, the same effect as when using the SBD 1 in the first embodiment, such as improvement in heat dissipation, can be obtained by the same method as when using the SBD 1. As such, the effects of the invention can be obtained regardless of the type of element as long as it is a vertical semiconductor element having a substrate and an epitaxial layer.

Figure 12A:
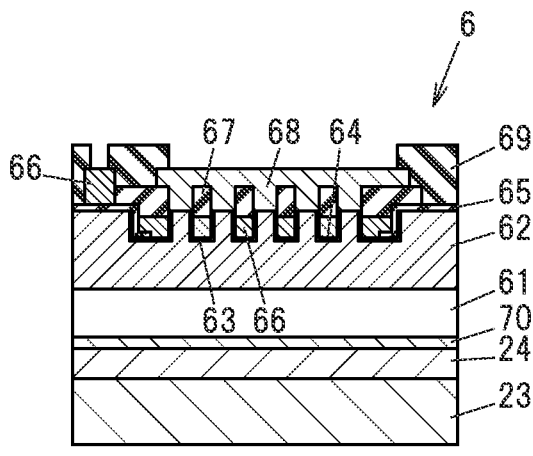
FIG. 12A is a vertical cross-sectional view showing a JFET in the second embodiment.

FIG. 12A is a vertical cross-sectional view showing a JFET 6 in the second embodiment. The JFET 6 includes a substrate 61, an epitaxial layer 62 formed on the substrate 61 by epitaxial growth, trenches 63 formed on an upper surface (a surface on the opposite side to a surface in contact with the substrate 61) of the epitaxial layer 62, insulating films 64 covering inner surfaces of the trenches 63, an insulating film 65 covering the inner surfaces of the outer trenches 63 and an outer peripheral portion of the upper surface of the epitaxial layer 62, a gate electrode 66 with portions buried in the trenches 63, insulators 67 covering the portions of the gate electrode 66 buried in the trenches 63, a source electrode 68 that is formed on the epitaxial layer 62 and the insulators 67 and is in Schottky contact with the epitaxial layer 62, an insulator 69 covering a portion of the gate electrode 66 exposed on the insulating film 65 and a side surface of the source electrode 68, a drain electrode 70 that is formed on a lower surface (a surface on the opposite side to a surface in contact with the epitaxial layer 62) of the substrate 61 and is in ohmic contact with the substrate 61, and the metal plate 23 as the support metal layer bonded onto a lower surface (a surface on the opposite side to a surface in contact with the substrate 61) of the drain electrode 70.

Figure 12B:
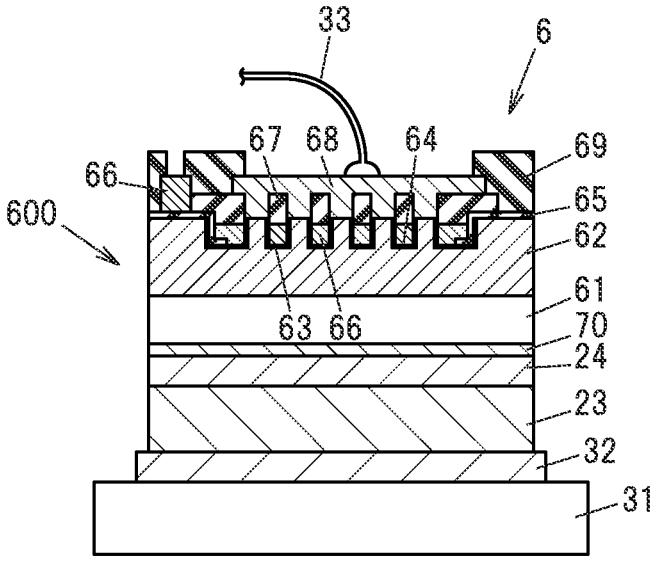
FIG. 12B is a vertical cross-sectional view showing a semiconductor device having the JFET in the second embodiment.

FIG. 12B is a vertical cross-sectional view showing a semiconductor device 600 having the JFET 6. The semiconductor device 600 includes the lead frame 31 and the JFET 6 face-up mounted on the lead frame 31. The JFET 6 is fixed to the lead frame 31 by the conductive adhesive 32 such as nano silver paste or solder (e.g., Au—Sn low-melting point solder). The lead frame 31 and the conductive adhesive 32 are respectively the same as those used in the first embodiment.

Also, when the JFET 6 is used as the vertical semiconductor element, it is possible to obtain the effect of improving heat dissipation, etc., by thinning the substrate 61 and using the metal plate 23, in the same manner as when using the SBD 1 in the first embodiment.

Third Embodiment

The third embodiment is different from the first embodiment in that a plating film is used as the support metal layer, in place of the metal plate. Note that, description for the same features as those in the first embodiment may be omitted or simplified.

(Structure of the Semiconductor Element)

Figure 13A:
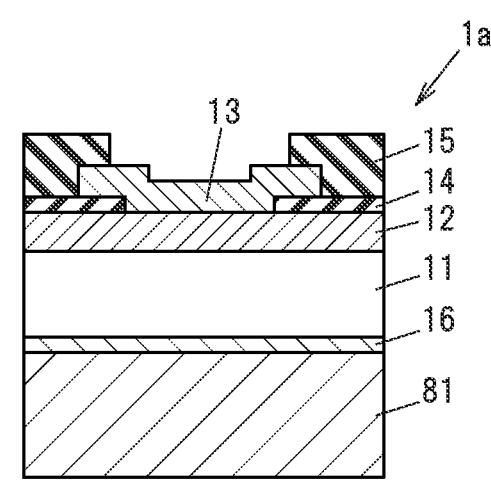
FIG. 13A is a vertical cross-sectional view showing a SBD in the third embodiment.

FIG. 13A is a vertical cross-sectional view showing a SBD 1a in the third embodiment. The SBD 1a includes the substrate 11, the epitaxial layer 12 formed on the substrate 11 by epitaxial growth, the anode electrode 13 that is formed on the upper surface (a surface on the opposite side to a surface in contact with the substrate 11) of the epitaxial layer 12 and is in Schottky contact with the epitaxial layer 12, the cathode electrode 16 that is formed on the lower surface (a surface on the opposite side to a surface in contact with the epitaxial layer 12) of the substrate 11 and is in ohmic contact with the substrate 11, and the plating film 81 as the support metal layer formed on the lower surface (a surface on the opposite side to a surface in contact with the substrate 11) of the cathode electrode 16.

The plating film 81 is formed of a metal such as Ni, Au, or Cu, and has a higher thermal conductivity than the substrate 11, similarly to the metal plate 23. The plating film 81 is formed, e.g., by performing electrolytic plating on a surface of the cathode electrode 16. A thickness of the plating film 81 can be set in the same manner as the thickness of the metal plate 23.

Since the substrate 11 is thinned by the thinning process, the SBD 1a is excellent in heat dissipation in the same manner as the SBD 1 in the first embodiment. The thin substrate 11 also has the effect of reducing on-resistance of the SBD 1a.

Figure 13B:
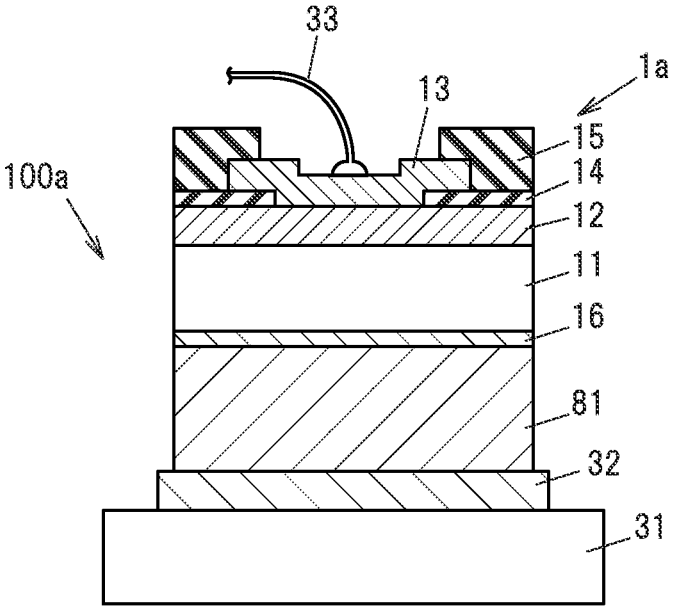
FIG. 13B is a vertical cross-sectional view showing a semiconductor device having the SBD in the third embodiment.

FIG. 13B is a vertical cross-sectional view showing a semiconductor device 100a having the SBD 1a. The semiconductor device 100a includes the lead frame 31 and the SBD 1a face-up mounted on the lead frame 31. The SBD 1a is fixed to the lead frame 31 by the conductive adhesive 32 such as nano silver paste or solder (e.g., Au—Sn low-melting point solder).

The plating film 81 of the SBD 1a is electrically connected to the lead frame 31 through the conductive adhesive 32. The anode electrode 13 of the SBD 1a is connected to a predetermined portion of the lead frame 31 (a portion insulated from a portion to which the plating film 81 is connected) through the bonding wire 33.

Since the substrate 11 is processed and thinned, a distance between the epitaxial layer 12 as a heat source and the lead frame 31 is small and heat generated in the epitaxial layer 12 can be efficiently released to the lead frame 31.

In addition, to suppress separation of the substrate 11 due to a difference in thermal expansion rate between the substrate 11 and the lead frame 31, a thermal expansion coefficient of the plating film 81 is preferably between the thermal expansion coefficient of the substrate 11 and the thermal expansion coefficient of the lead frame 31.

When, e.g., the lead frame 31 is formed of copper or a copper-based alloy, it is preferable that the plating film 81 be also formed of a copper-based alloy such as Cu—Mo alloy to satisfy the above-mentioned conditions of the thermal expansion coefficient.

In addition, a wiring board may be used in place of the lead frame 31. In this case, the plating film 81 of the SBD 1a is electrically connected to wiring on the wiring board through the conductive adhesive 32. In addition, the thermal expansion coefficient of the plating film 81 is preferably between the thermal expansion coefficient of the substrate 11 and the thermal expansion coefficient of the base material of the wiring board. When the SBD 1a does not include the substrate 11, the thermal expansion coefficient of the plating film 81 is preferably between the thermal expansion coefficient of the epitaxial layer 12 and the thermal expansion coefficient of the base material of the wiring board.

Next, a method for manufacturing the SBD 1a in the third will be described with a specific example. However, the method for manufacturing the SBD 1a is not limited to the following example.

(Method for Manufacturing the Semiconductor Element)

FIGS. 14A to 14C, 15A and 15B are vertical cross-sectional views showing an example of a process of manufacturing the SBD 1a and the semiconductor device 100a having the SBD 1a in the third embodiment.

Firstly, the steps shown in FIGS. 4A to 4C, up to the thinning process on the substrate 11 in the process of manufacturing the semiconductor device 100 in the first embodiment, are performed.

Figure 14A:
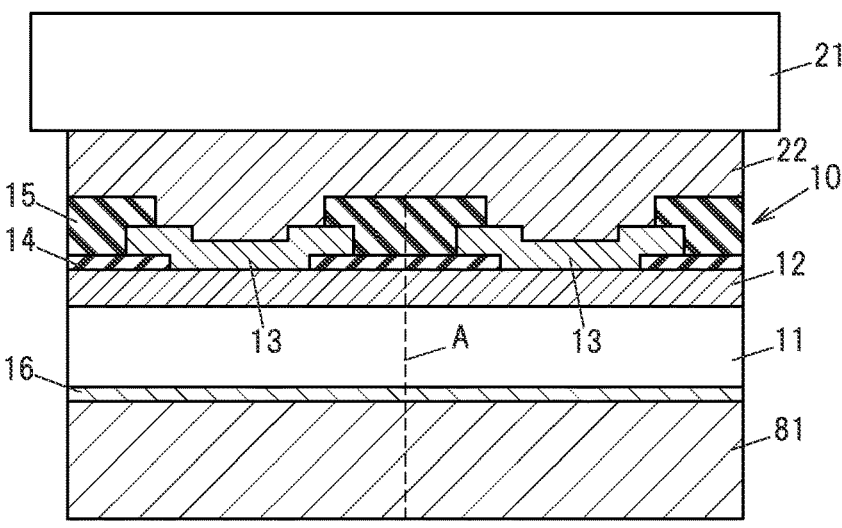
FIG. 14A is a vertical cross-sectional view showing an example of a process of manufacturing the SBD and the semiconductor device having the SBD in the third embodiment.

Next, as shown in FIG. 14A, the cathode electrode 16 is formed on the lower surface of the substrate 11, and the plating film 81 as the support metal layer is formed on the lower surface of the cathode electrode 16 by a plating process such as electrolytic plating.

The plating film 81 in the example shown in FIG. 14A is one continuous film and is cut together with the semiconductor wafer 10 in the dicing step performed later, but instead of forming this one continuous plating film, one plating film may be formed on each element region (a region to be one SBD 1*a* after dicing) by patterning using a resist mask, etc. In this case, the number of steps increases since the pattern of the plating film is formed, but clogging of the blade can be suppressed due to no cutting of the plating film 81 in the dicing step.

Figure 14B:
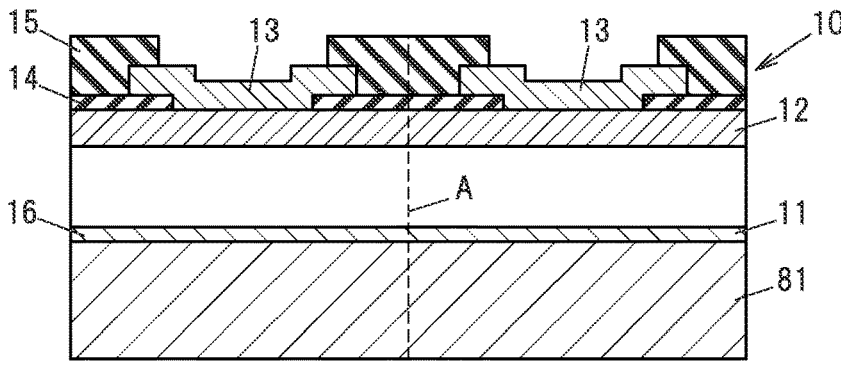
FIG. 14B is a vertical cross-sectional view showing the example of the process of manufacturing the SBD and the semiconductor device having the SBD in the third embodiment.

Next, as shown in FIG. 14B, the semiconductor wafer 10 supported by the plating film 81 is separated from the support substrate 21 and the adhesive 22.

Figure 14C:
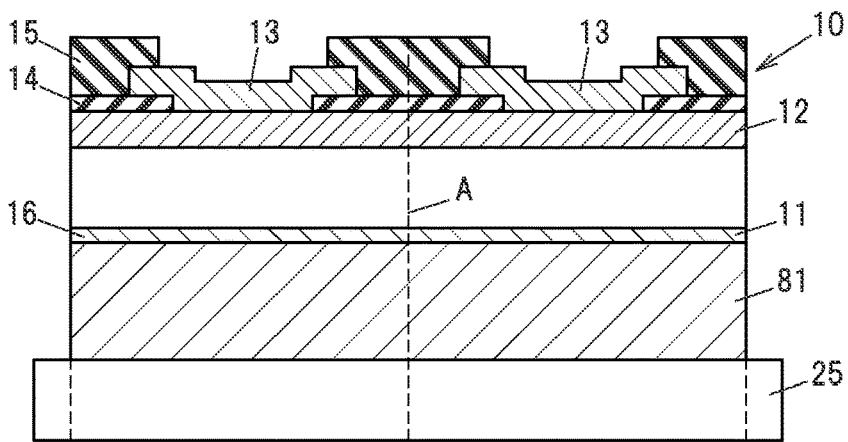
FIG. 14C is a vertical cross-sectional view showing the example of the process of manufacturing the SBD and the semiconductor device having the SBD in the third embodiment.

Next, as shown in FIG. 14C, the dicing tape 25 is attached to a lower surface of the plating film 81.

Figure 15A:
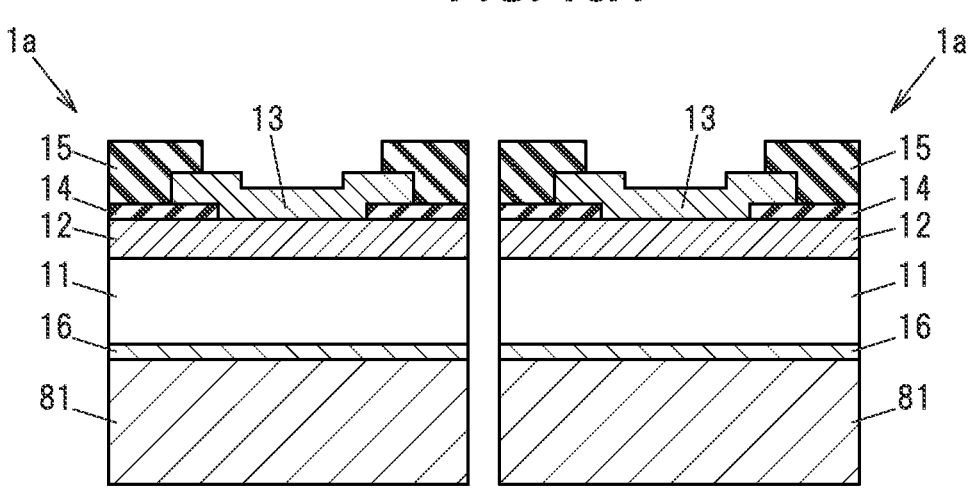
FIG. 15A is a vertical cross-sectional view showing the example of the process of manufacturing the SBD and the semiconductor device having the SBD in the third embodiment.

Next, as shown in FIG. 15A, the semiconductor wafer 10 is singulated into individual pieces by dicing, thereby obtaining plural SBDs 1*a* each including the plating film 81. In this step, the semiconductor wafer 10 and the plating film 81 are cut along the dicing line A by the dicing blade. Here, since mechanical strength of the semiconductor wafer 10 is reinforced by the plating film 81, damage on the semiconductor wafer 10 during dicing can be suppressed.

In this regard, when one plating film 81 is formed on each element region by patterning in the step shown in FIG. 14A, the dicing step shown in FIG. 15A is performed with no cutting of the plating film 81.

Figure 15B:
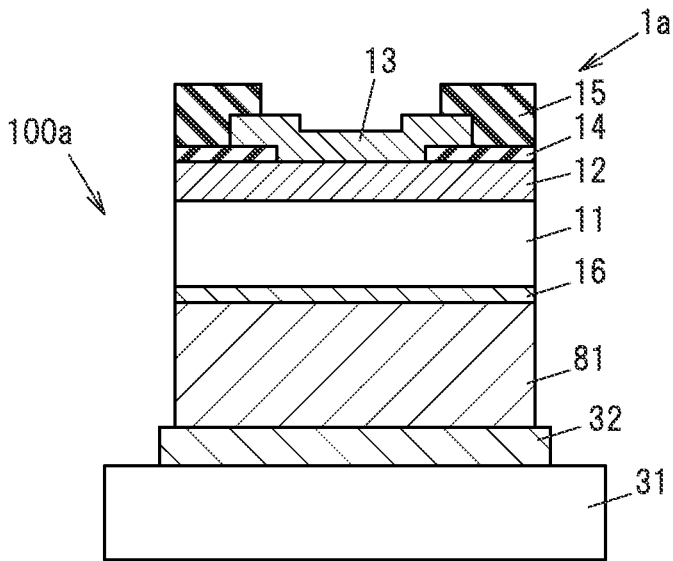
FIG. 15B is a vertical cross-sectional view showing the example of the process of manufacturing the SBD and the semiconductor device having the SBD in the third embodiment.

Next, as shown in FIG. 15B, the plating film 81 side of the SBD 1*a* is fixed to the lead frame 31, and the plating film 81 is electrically connected to the lead frame 31. Alternatively, a wiring board may be used in place of the lead frame 31, as described above. When the wiring board is used, the plating film 81 is electrically connected to wiring on the wiring board. Then, after connection of the bonding wire 33, etc., the semiconductor device 100*a* is obtained.

In this regard, the method in the third embodiment in which the plating film 81 is used can also be applied to vertical semiconductor elements other than the SBD 1*a*, e.g., to the trench SBD 4 and the JFET 6 in the second embodiment.

Fourth Embodiment

In the fourth embodiment, a recessed portion is provided on the substrate and heat dissipation of the semiconductor element is thereby improved while suppressing a decrease in mechanical strength of the semiconductor wafer. Note that, description for the same features as those in the first embodiment may be omitted or simplified.
(Structure of the Semiconductor Element)

Figures 16A, 16B:
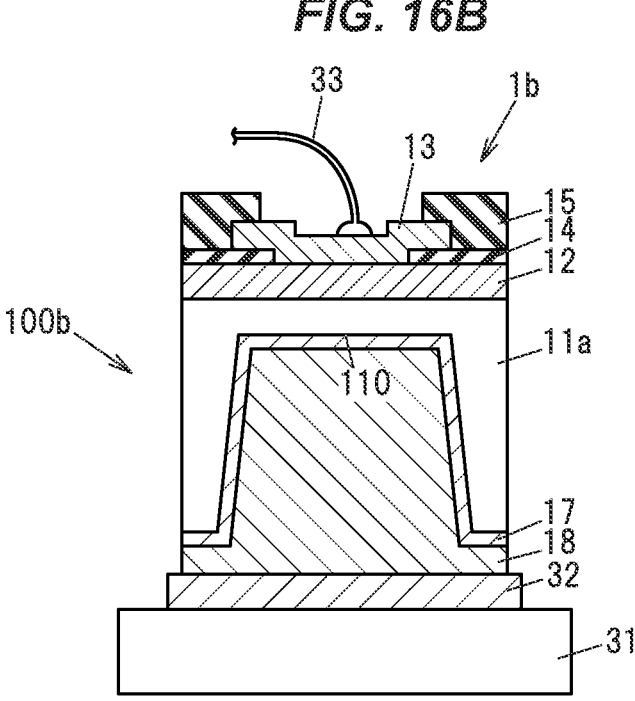
FIG. 16A is a vertical cross-sectional view showing a SBD in the fourth embodiment.
FIG. 16B is a vertical cross-sectional view showing a semiconductor device having the SBD in the fourth embodiment.

FIG. 16A is a vertical cross-sectional view showing a SBD 1*b* in the fourth embodiment. The SBD 1*b* includes a substrate 11*a* having a recessed portion 110 on a lower surface (a surface on the opposite side to a surface in contact with the epitaxial layer 12), the epitaxial layer 12 formed on the substrate 11*a* by epitaxial growth, the anode electrode 13 that is formed on the upper surface (a surface on the opposite side to a surface in contact with the substrate 11*a*) of the epitaxial layer 12 and is in Schottky contact with the epitaxial layer 12, a cathode electrode 17 that is formed on the lower surface of the substrate 11*a* including an inner surface of the recessed portion 110 and is in ohmic contact with the substrate 11*a*, and a conductor layer 18 that is formed on a lower surface (a surface on the opposite side to a surface in contact with the substrate 11*a*) of the cathode electrode 17 so as to fill the recessed portion 110.

The substrate 11*a* is formed of a Ga$_2$O$_3$-based semiconductor and contains an n-type dopant, in the same manner as the substrate 11 in the first embodiment.

Since the portion of the substrate 11*a* at which the recessed portion 110 is provided is thin, heat generated in the epitaxial layer 12 can be transferred through the thin portion to the conductor layer 18 and further released to the lead frame or the wiring board, thereby efficiently dissipating the heat. On the other hand, a portion of the substrate 11*a* at which the recessed portion 110 is not provided is thick, hence, mechanical strength of the substrate 11*a* can be maintained by the thick portion. The thin portion of the substrate 11*a* at which the recessed portion 110 is provided also has the effect of reducing on-resistance of the SBD 1*b*.

A thickness $T_1$ of the portion of the substrate 11*a* at which the recessed portion 110 is provided, e.g., a distance between a bottom of the recessed portion 110 and the substrate 11*a* is preferably not more than 150 μm to efficiently release the heat generated in the epitaxial layer 12 from the substrate 11*a* side. Meanwhile, a thickness $T_2$ of the portion of the substrate 11*a* at which the recessed portion 110 is not provided is a thickness of the substrate 11*a* before forming the recessed portion 110, and is in a range of, e.g., not less than 200 μm an not more than 700 μm.

The substrate 11*a* may have one recessed portion 110 or may have plural recessed portions 110.

The conductor layer 18 is formed of, e.g., a conductive paste such as nano silver paste or Au—Sn low-melting point solder. Thermal conductivity of the conductor layer 18 is higher than thermal conductivity of the substrate 11. Thus, a decrease in the efficiency of heat dissipation through the conductor layer 18 can be suppressed. In addition, by filling the recessed portion 110 with the conductor layer 18, it is possible to reduce unevenness of the bottom surface of the SBD 1*b* and to easily bond the SBD 1*b* to the lead frame 31. To bond the SBD 1*b* to the lead frame 31 more easily, flatness of a bottom surface of the conductor layer 18 is preferably high.

FIG. 16B is a vertical cross-sectional view showing a semiconductor device 100*b* having the SBD 1*b*. The semiconductor device 100*b* includes the frame 31 and the SBD 1*b* face-up mounted on the lead frame 31. The SBD 1*b* is fixed to the lead frame 31 by the conductive adhesive 32 such as nano silver paste or solder (e.g., Au—Sn low-melting point solder).

The conductor layer 18 of the SBD 1*b* is electrically connected to the lead frame 31 through the conductive adhesive 32. The anode electrode 13 of the SBD 1*b* is connected to a predetermined portion of the lead frame 31 (a portion insulated from a portion to which the conductor layer 18 is connected) through the bonding wire 33.

In this regard, the conductive adhesive 32 is not used when the conductor layer 18 is used as a bonding material to bond to the lead frame 31. In this case, the conductor layer 18 in the form of paste is brought into contact with the lead frame 31 and the conductive layer 18 is then solidified.

Since the portion of the substrate 11*a* at which the recessed portion 110 is provided is thin, the distance between the epitaxial layer 12 as a heat source and the lead frame 31 is small and heat generated in the epitaxial layer 12 can be efficiently released to the lead frame 31.

In addition, a wiring board may be used in place of the lead frame 31. In this case, the conductor layer 18 of the SBD 1*b* is electrically connected to wiring on the wiring board.

Next, a method for manufacturing the SBD 1*b* in the fourth embodiment will be described with a specific example. However, the method for manufacturing the SBD 1*b* is not limited to the following example.

(Method for Manufacturing the Semiconductor Element)

FIGS. 17A to 17C, 18A to 18C and 19 are vertical cross-sectional views showing an example of a process of manufacturing the SBD 1*b* and the semiconductor device 100*b* having the SBD 1*b* in the fourth embodiment.

Firstly, the steps shown in FIGS. 4A and 4B, up to fixing the epitaxial layer 12 side of the semiconductor wafer 10 to the support substrate 21 in the process of manufacturing the semiconductor device 100 in the first embodiment, are performed.

Figure 17A:
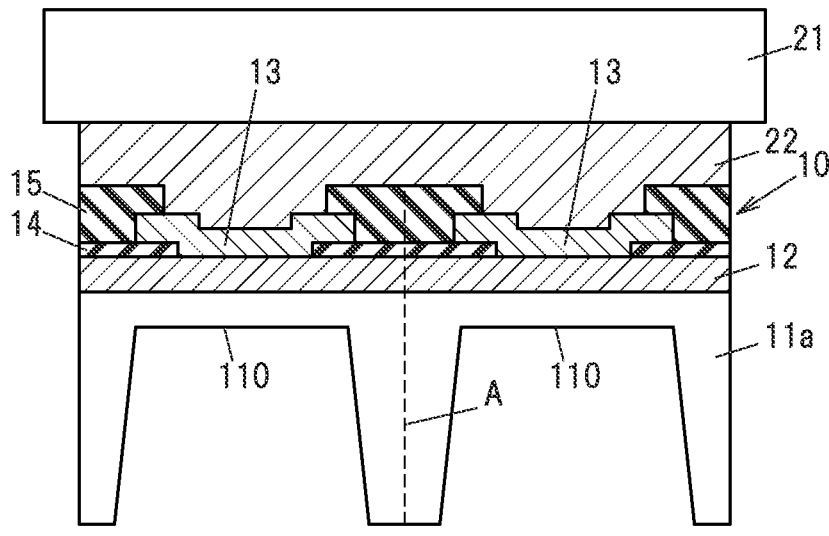
FIG. 17A is a vertical cross-sectional view showing an example of a process of manufacturing the SBD and the semiconductor device having the SBD in the fourth embodiment.

Next, as shown in FIG. 17A, the recessed portions 110 are formed on the lower surface of the substrate 11 by dry etching or wet etching. A resist mask used at this point has a shape corresponding to the pattern of the recessed portions 110 formed by photolithography, etc.

Figure 17B:
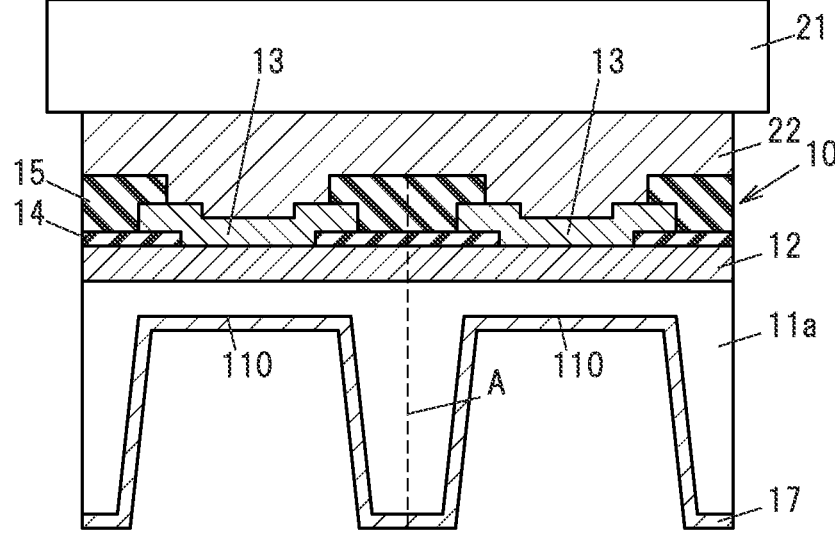
FIG. 17B is a vertical cross-sectional view showing the example of the process of manufacturing the SBD and the semiconductor device having the SBD in the fourth embodiment.

Next, as shown in FIG. 17B, the cathode electrode 17 is formed on the lower surface of the substrate 11 including the inner surfaces of the recessed portions 110.

Figure 17C:
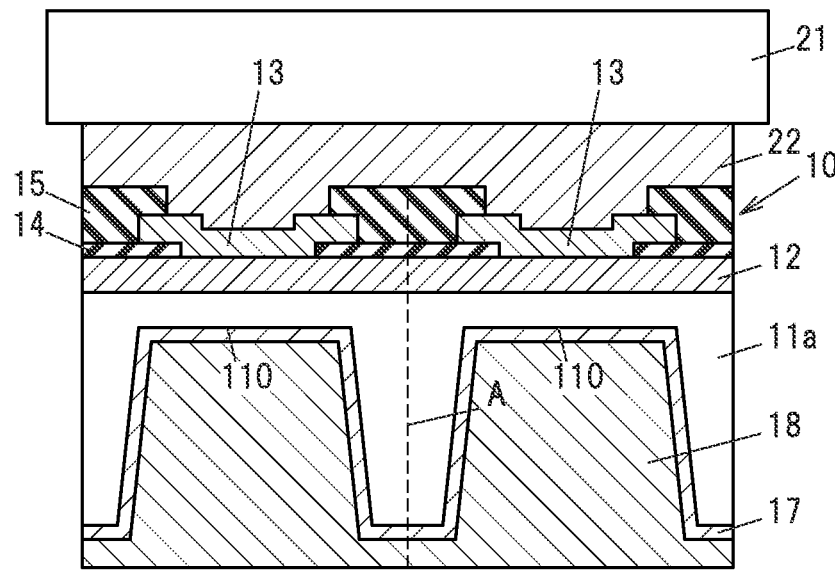
FIG. 17C is a vertical cross-sectional view showing the example of the process of manufacturing the SBD and the semiconductor device having the SBD in the fourth embodiment.

Next, as shown in FIG. 17C, the conductor layer 18 is formed on the lower surface of the cathode electrode 17 so as to fill the recessed portions 110. The conductor layer 18 is formed, e.g., by applying a conductive adhesive such as nano silver paste, nano copper paste or solder (e.g., Au—Sn low-melting point solder) onto the lower surface of the cathode electrode 17 and solidifying with heat. To enhance the flatness of the bottom surface of the conductor layer 18, it is preferable that the sample fixed to the support substrate 21 be flipped so that the recessed portions 110 face upward, and the above-mentioned conductive adhesive in the form of liquid be supplied into the recessed portions 110 by a dispenser and solidified by heating.

Figure 18A:
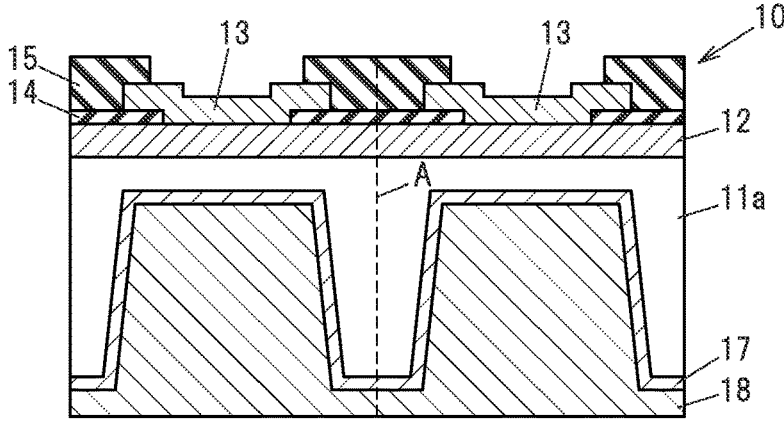
FIG. 18A is a vertical cross-sectional view showing the example of the process of manufacturing the SBD and the semiconductor device having the SBD in the fourth embodiment.

Next, as shown in FIG. 18A, the semiconductor wafer 10 is separated from the support substrate 21 and the adhesive 22

Figure 18B:
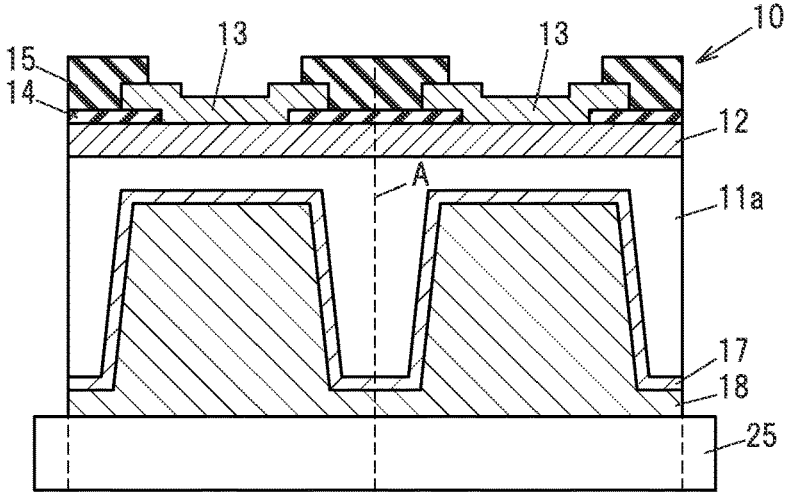
FIG. 18B is a vertical cross-sectional view showing the example of the process of manufacturing the SBD and the semiconductor device having the SBD in the fourth embodiment.

Next, as shown in FIG. 18B, the dicing tape 25 is attached to the lower surface of the conductor layer 18.

Figure 18C:
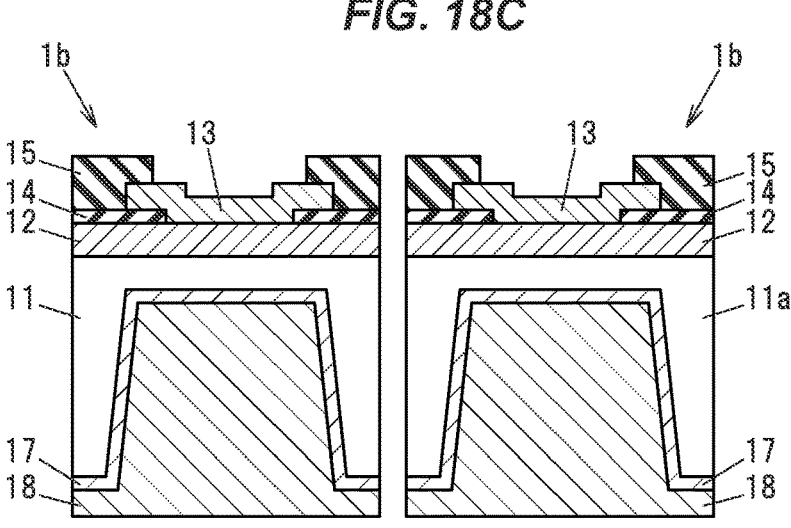
FIG. 18C is a vertical cross-sectional view showing the example of the process of manufacturing the SBD and the semiconductor device having the SBD in the fourth embodiment.

Next, as shown in FIG. 18C, the semiconductor wafer 10 is singulated into individual pieces by dicing, thereby obtaining plural SBDs 1*b* each including the conductor layer 18. In this step, the semiconductor wafer 10 and the conductor layer 18 are cut along the dicing line A by the dicing blade. Here, since mechanical strength of the semiconductor wafer 10 is maintained by the thick portion of the substrate 11*a* at which the recessed portion 110 is not provided, damage on the semiconductor wafer 10 during dicing can be suppressed.

Figure 19:
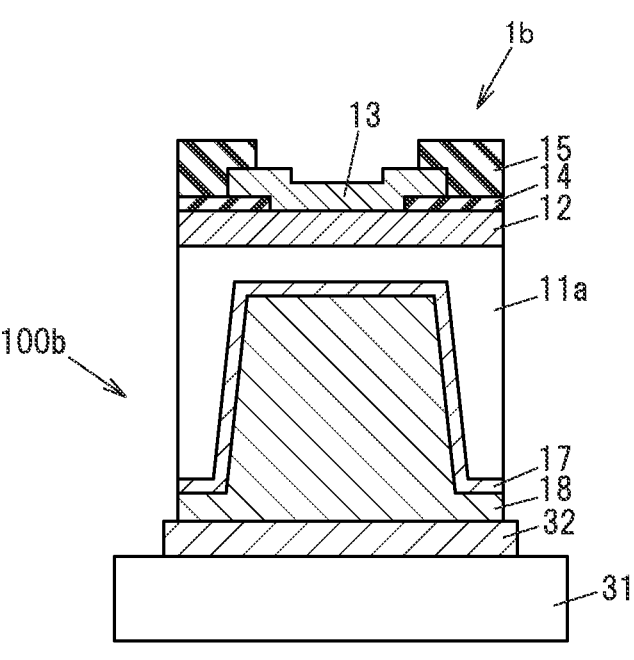
FIG. 19 is a vertical cross-sectional view showing the example of the process of manufacturing the SBD and the semiconductor device having the SBD in the fourth embodiment.

Next, as shown in FIG. 19, the conductor layer 18 side of the SBD 1*b* is fixed to the lead frame 31 using the conductive adhesive 32, and the conductor layer 18 is electrically connected to the lead frame 31. When the conductive adhesive 32 is not used, the conductor layer 18 is brought into contact with the lead frame 31 and is then solidified. A wiring board may be used in place of the lead frame 31, as described above. When the wiring board is used, the conductor layer 18 is electrically connected to wiring on the wiring board. Then, after connection of the bonding wire 33, etc., the semiconductor device 100*b* is obtained.

In this regard, the method in the fourth embodiment in which the recessed portion is provided on the substrate can also be applied to vertical semiconductor elements other than the SBD 1*b*, e.g., to the trench SBD 4 and the JFET 6 in the second embodiment.

Fifth Embodiment

The fifth embodiment is different from the fourth embodiment in that a raised portion corresponding to the recessed portion of the substrate 11*a* is provided on a lead frame 31*a*. Note that, description for the same features as those in the fourth embodiment may be omitted or simplified.

(Structure of the Semiconductor Element)

Figure 20A:
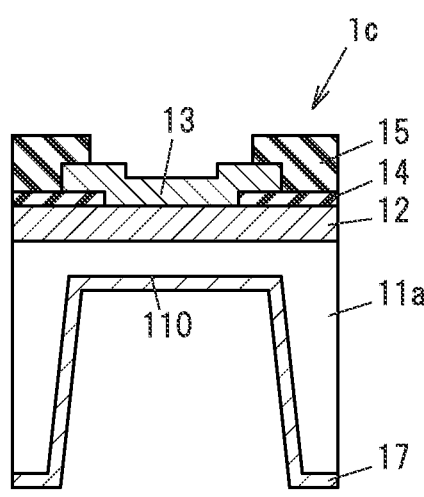
FIG. 20A is a vertical cross-sectional view showing a SBD in the fifth embodiment.

FIG. 20A is a vertical cross-sectional view showing a SBD 1*c* in the fifth embodiment. The SBD 1*c* is different from the SBD 1*b* of the fourth embodiment in that the conductor layer 18 is not included.

Figure 20B:
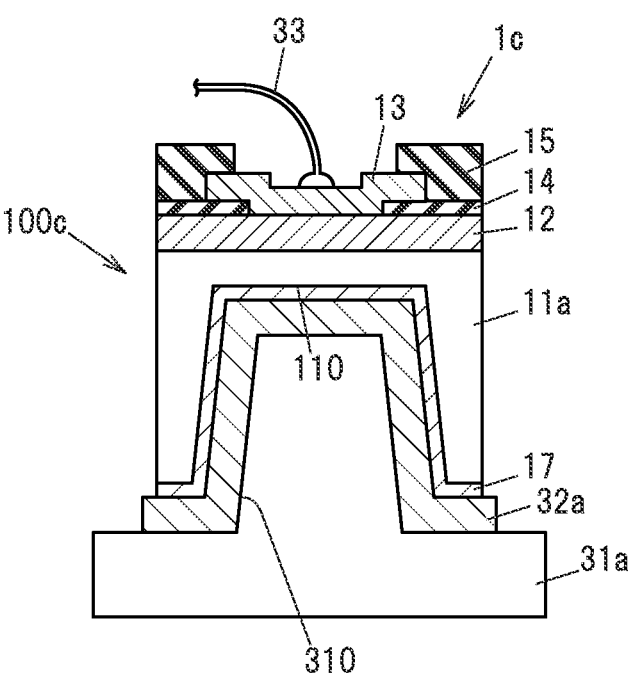
FIG. 20B is a vertical cross-sectional view showing a semiconductor device having the SBD in the fifth embodiment.

FIG. 20B is a vertical cross-sectional view showing a semiconductor device 100*c* having the SBD 1*c*. The semiconductor device 100*c* includes the lead frame 31*a* having a raised portion 310 corresponding to the recessed portion 110 of the substrate 11*a* and the SBD 1*c* face-up mounted on the lead frame 31*a*.

The SBD 1*c* is fixed to the lead frame 31*a* so that the raised portion is inserted into the recessed portion. In addition, the cathode electrode 17 is bonded to the raised portion 310 of the lead frame 31*a* by a conductive adhesive 32*a* such as nano silver paste or solder (e.g., Au—Sn low-melting point solder).

The cathode electrode 17 of the SBD 1*c* is electrically connected to the lead frame 31*a* through the conductive adhesive 32*a*. The anode electrode 13 of the SBD 1*c* is connected to a predetermined portion of the lead frame 31*a* (a portion insulated from a portion to which the cathode electrode 17 is connected) through the bonding wire 33.

In the SBD 1*c*, since the portion of the substrate 11*a* at which the recessed portion 110 is provided is thin and also the raised portion 310 of the lead frame 31*a* is inserted into the recessed portion 110, a distance between the epitaxial layer 12 as a heat source and the lead frame 31*a* is small and heat generated in the epitaxial layer 12 can be efficiently released to the lead frame 31*a*.

Next, a method for manufacturing the SBD 1*c* in the fifth embodiment will be described with a specific example. However, the method for manufacturing the SBD 1*c* is not limited to the following example.

(Method for Manufacturing the Semiconductor Element)

FIGS. 21A to 21C and 22 are vertical cross-sectional views showing an example of a process of manufacturing the SBD 1*c* and the semiconductor device 100*c* having the SBD 1*c* in the fifth embodiment.

Firstly, the steps shown in FIGS. 17A and 17B, up to formation of the cathode electrode 17 in the process of manufacturing the semiconductor device 100*b* in the fourth embodiment, are performed.

Next, as shown in FIG. 21A, the semiconductor wafer 10 is separated from the support substrate 21 and the adhesive 22

Next, as shown in FIG. 21B, the dicing tape 25 is attached to the lower surface of the cathode electrode 17 located outside the recessed portion 110.

Next, as shown in FIG. 21C, the semiconductor wafer 10 is singulated into individual pieces by dicing, thereby obtaining plural SBDs 1*c*. In this step, the semiconductor wafer 10 is cut along the dicing line A by the dicing blade. Here, since mechanical strength of the semiconductor wafer 10 is maintained by the thick portion of the substrate 11*a* at which the recessed portion 110 is not provided, damage on the semiconductor wafer 10 during dicing can be suppressed.

Figure 22:
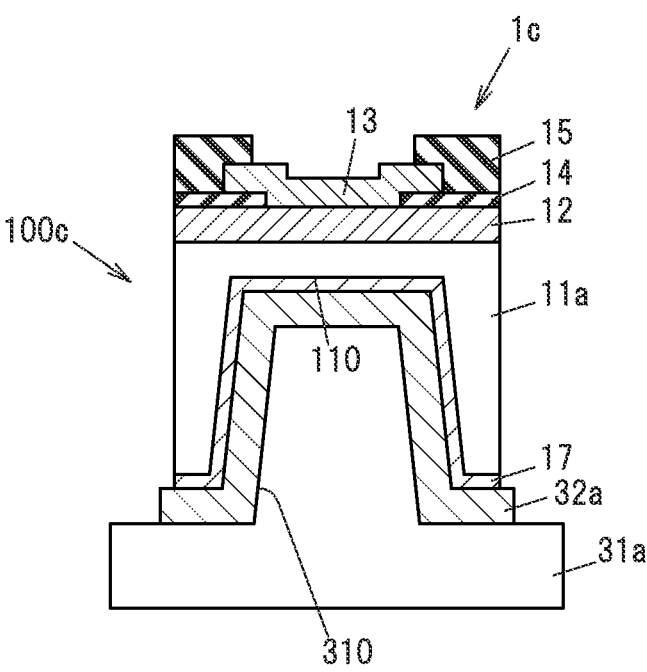
FIG. 22 is a vertical cross-sectional view showing the example of the process of manufacturing the SBD and the semiconductor device having the SBD in the fifth embodiment.

Next, as shown in FIG. 22, the SBD 1*c* is fixed to the lead frame 31*a* using a conductive adhesive 32*b* so that the raised portion 310 is inserted into the recessed portion 110, and the cathode electrode 17 is electrically connected to the lead frame 31*a*. Then, after connection of the bonding wire 33, etc., the semiconductor device 100*c* is obtained.

In this regard, the method in the fifth embodiment in which the substrate having the recessed portion is fixed to the lead frame having the raised portion can also be applied to vertical semiconductor elements other than the SBD 1c, e.g., to the trench SBD 4 and the JFET 6 in the second embodiment.

Sixth Embodiment

The sixth embodiment is different from the first embodiment in that the semiconductor element is face-down-mounted. Note that, description for the same features as those in the first embodiment may be omitted or simplified.
(Structure of the Semiconductor Element)

Figure 23:
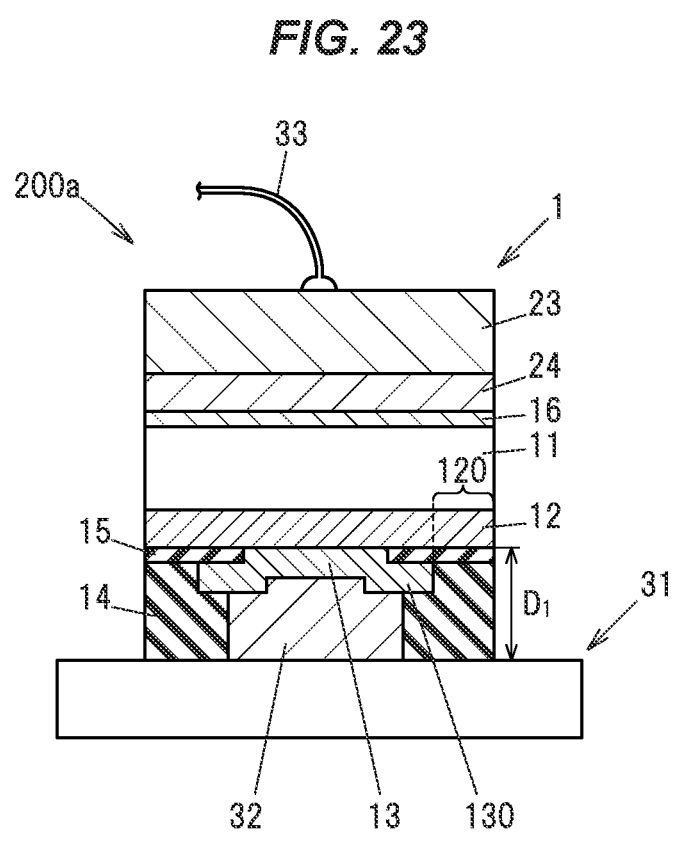

FIG. 23 is a vertical cross-sectional view showing a semiconductor device 200a in the sixth embodiment. The semiconductor device 200a includes the lead frame 31 and the SBD 1 face-down mounted on the lead frame 31. The SBD 1 is fixed and electrically connected to the lead frame 31 by the conductive adhesive 32.

The semiconductor device 200a is different from the semiconductor device 100 of first embodiment in that the SBD 1 is face-down mounted. In the semiconductor device 200a, the bonding wire 33 is connected to the metal plate 23 located on the upper side.

In the semiconductor device 200a, since the SBD 1 is face-down mounted, heat generated in the epitaxial layer 12 can be released to the lead frame 31 without passing through the substrate 11. In addition, since the substrate 11 is thinned, heat generated in the epitaxial layer 12 can be released also from the bonding wire 33, etc., through the substrate 11.

In addition, in the semiconductor device 200a, a field plate portion 130 is provided on the anode electrode 13 of the SBD 1 to disperse the electric field near an edge of the anode electrode 13 where the electric field is particularly likely to concentrate, and a decrease in breakdown voltage thereby can be suppressed. However, when a reverse bias voltage is applied to the SBD 1, charges gather on the surface of the epitaxial layer 12 due to the electric field generated in the lead frame 31 located below the epitaxial layer 12 (the field effect), and if the distance between the epitaxial layer 12 and the lead frame 31 is too small, the electric field intensity on the surface of the epitaxial layer 12 becomes high enough to affect breakdown voltage of the SBD 1.

Therefore, a distance $D_1$ between an outer peripheral portion 120 of the epitaxial layer 12 and the lead frame 31 is preferably set to not less than 3 $\mu$m to suppress a decrease in breakdown voltage of the SBD 1 due to the field effect.

Figure 24A:
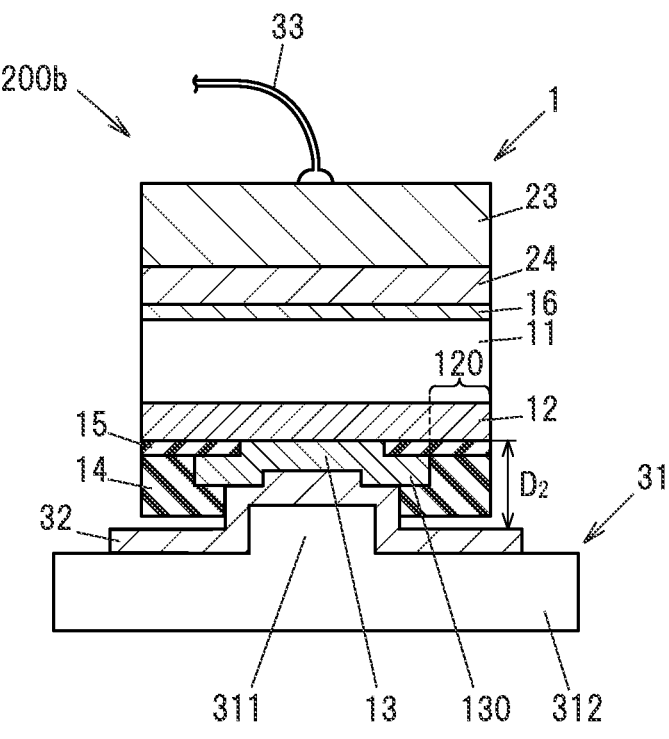
FIG. 24A is a vertical cross-sectional view showing another semiconductor device in the sixth embodiment.
Figure 24B:
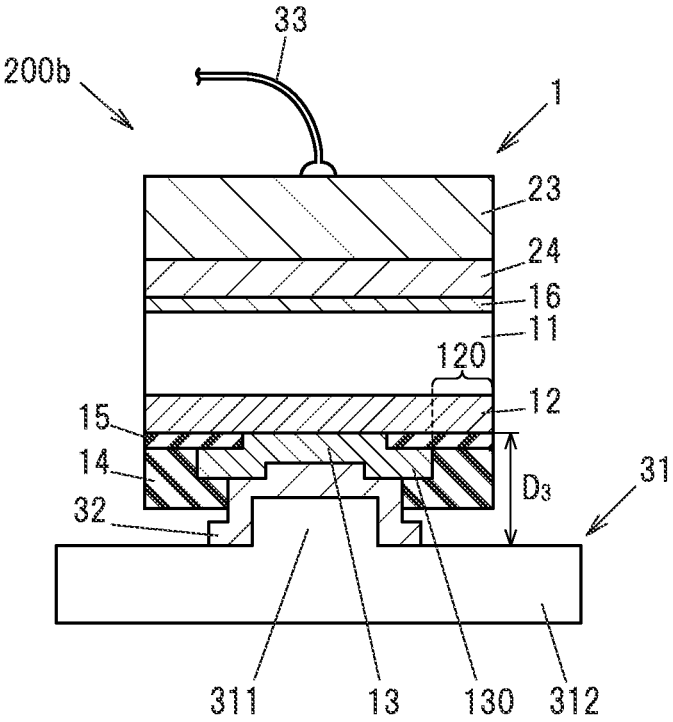
FIG. 24B is a vertical cross-sectional view showing another semiconductor device in the sixth embodiment.

FIGS. 24A and 24B are vertical cross-sectional views showing semiconductor devices 200b in the sixth embodiment. The semiconductor device 200b includes the lead frame 31 and the SBD 1 face-down mounted on the lead frame 31, in the same manner as the semiconductor device 200a.

In the semiconductor device 200b, the lead frame 31 has a raised portion 311 on a surface thereof and the SBD 1 is mounted so as to rest on the top of the raised portion 311 of the lead frame 31. In addition, the outer peripheral portion 120 of the epitaxial layer 12, which is located on the outer side of the field plate portion 130, is located directly above a flat portion 312 of the lead frame 31 which is a portion at which the raised portion 311 is not provided. This increases the distance between the outer peripheral portion 120 and the conductive adhesive 32 or the lead frame 31, and a decrease in breakdown voltage of the SBD 1 due to the field effect can be thereby suppressed.

Here, $D_2$ is a distance between the outer peripheral portion 120 and the conductive adhesive 32 located directly thereunder when the conductive adhesive 32 is present on the flat portion 312 directly below the outer peripheral portion 120 as shown in FIG. 24A, and $D_3$ is a distance between the outer peripheral portion 120 and the flat portion 312 when the conductive adhesive 32 is not present directly below the outer peripheral portion 120 as shown in FIG. 24B. To more effectively suppress a decrease in breakdown voltage of the SBD 1 due to the field effect, both the distance $D_2$ and the distance $D_3$ are preferably not less than 3 $\mu$m.

The raised portion 311 of the lead frame 31 may be formed by pressing. In this case, the lead frame 31 has a recessed portion on the back side of the raised portion 311.

In addition, although the raised portion 311 and the flat portion 312 of the lead frame 31 are integrated in the examples shown in FIGS. 24A and 24B, a conductor having the same shape as the raised portion 311 may be bonded to the flat portion 312 of the lead frame 31 by a conductive adhesive so as to serve as the raised portion.

In addition, in the semiconductor device 200a and the semiconductor device 200b, other semiconductor elements such as the SBD 1a, the SBD 1b, the SBD 1c, the trench SBD 4 or the JFET 6 may be used in place of the SBD 1.

Effects of the Embodiments

In the first to sixth embodiments, it is possible to improve heat dissipation of the vertical semiconductor element such as SBD by thinning the substrate formed of a $Ga_2O_3$-based semiconductor with low thermal conductivity, or by partially thinning the substrate by forming the recessed portion. In addition, by bonding the metal plate, or forming the plating film, or leaving the thick portion around the recessed portion, it is possible to suppress a decrease in mechanical strength due to thinning of the substrate and thereby suppress damage on the semiconductor wafer during dicing.

Although the embodiments of the invention have been described, the invention is not intended to be limited to the embodiments, and the various kinds of modifications can be implemented without departing from the gist of the invention. For example, even when another semiconductor element such as a vertical MOSFET or MISFET is used as the vertical semiconductor element, similar effects can be obtained by the same method as those in the first to fifth embodiments in which the SBD, etc., is used. In addition, in each embodiment, a clip formed of Cu, etc., or a ribbon formed of Al, etc., may be used in place of the bonding wire 33.

In addition, the constituent elements in the embodiments can be arbitrarily combined without departing from the gist of the invention. In addition, the invention according to claims is not to be limited to the embodiments described above. Further, it should be noted that not all combinations of the features described in the embodiments are necessary to solve the problem of the invention.

INDUSTRIAL APPLICABILITY

Provided are a method for manufacturing a semiconductor element formed using a $Ga_2O_3$-based semiconductor, which is a semiconductor element manufacturing method by which plural semiconductor elements having a structure with excellent heat dissipation can be obtained from one wafer while suppressing damage during dicing, a semiconductor element obtained by the semiconductor element manufacturing method, a method for manufacturing a semiconductor device including the semiconductor element manufacturing method, and a semiconductor device obtained by the method for manufacturing a semiconductor device.

REFERENCE SIGNS LIST

1, 1a, 1b, 1c SBD
4 TRENCH SBD
6 JFET
11, 11a, 41, 61 SUBSTRATE
110 RECESSED PORTION
12, 42, 62 EPITAXIAL LAYER
13, 46 ANODE ELECTRODE
16, 17, 48 CATHODE ELECTRODE
21 SUPPORT SUBSTRATE
23 METAL PLATE
31, 31a LEAD FRAME
310 RAISED PORTION
68 SOURCE ELECTRODE
70 DRAIN ELECTRODE
81 PLATING FILM
100, 100a, 100b, 100c, 400, 600 SEMICONDUCTOR DEVICE

The invention claimed is:

1. A semiconductor device, comprising:

a substrate comprising a $Ga_2O_3$-based semiconductor and having a thickness of not more than 250 μm;

an epitaxial layer comprising a $Ga_2O_3$-based semiconductor and located on the substrate;

a first electrode on an upper surface of the epitaxial layer;

a second electrode on a lower surface of the substrate;

a support metal layer that is located on a lower surface of the second electrode and has a thermal conductivity higher than a thermal conductivity of the substrate and a thickness of 100 to 400 μm; and a lead frame or a wiring board to which the support metal layer is fixed, wherein the support metal layer is electrically connected to the lead frame or a wiring on the wiring board, and wherein a thermal expansion coefficient of the support metal layer is between a thermal expansion coefficient of the substrate and a thermal expansion coefficient of the lead frame or a base material of the wiring board.

2. A semiconductor device, comprising:

a substrate comprising a $Ga_2O_3$-based semiconductor and having a thickness of not more than 250 μm;

an epitaxial layer comprising a $Ga_2O_3$-based semiconductor and located on the substrate;

a first electrode on an upper surface of the epitaxial layer;

a second electrode on a lower surface of the substrate;

a support metal layer that is located on a lower surface of the second electrode and has a thermal conductivity higher than a thermal conductivity of the substrate and a thickness of 100 to 400 μm; and a lead frame to which the support metal layer is fixed, wherein the support metal layer is electrically connected to the lead frame, and wherein a thermal expansion coefficient of the support metal layer is between a thermal expansion coefficient of the substrate and a thermal expansion coefficient of the lead frame.

* * * * *